(12) United States Patent
Volkovoy et al.

(10) Patent No.: US 11,232,937 B2
(45) Date of Patent: Jan. 25, 2022

(54) AMPLIFIER

(71) Applicant: ISOTOPX LTD, Cheshire (GB)

(72) Inventors: Vadim Volkovoy, Cheshire (GB);
Anthony Michael Jones, Cheshire (GB); Damian Paul Tootell, Cheshire (GB)

(73) Assignee: ISOTOPX LTD, Cheshire (GB)

( * ) Notice: Subject to any disclaimer, the term of this patent is extended or adjusted under 35 U.S.C. 154(b) by 101 days.

(21) Appl. No.: 16/494,083

(22) PCT Filed: Nov. 10, 2017

(86) PCT No.: PCT/GB2017/053408
§ 371 (c)(1),
(2) Date: Sep. 13, 2019

(87) PCT Pub. No.: WO2018/167449
PCT Pub. Date: Sep. 20, 2018

(65) Prior Publication Data
US 2020/0136569 A1  Apr. 30, 2020

(30) Foreign Application Priority Data

Mar. 16, 2017 (GB) .................................. 1704236
Mar. 16, 2017 (GB) .................................. 1704237

(51) Int. Cl.
*H03F 3/08* (2006.01)
*H01J 49/02* (2006.01)
(Continued)

(52) U.S. Cl.
CPC .............. *H01J 49/025* (2013.01); *H03F 1/08* (2013.01); *H03F 1/303* (2013.01); *H03F 1/34* (2013.01);
(Continued)

(58) Field of Classification Search
CPC .... H01J 49/025; H03F 1/303; H03F 3/45475; H03F 3/70; H03F 1/08; H03F 1/34;
(Continued)

(56) References Cited

U.S. PATENT DOCUMENTS 4,689,578 A   8/1987  Spychalski
4,956,716 A   9/1990  Hewitt
(Continued)

FOREIGN PATENT DOCUMENTS

DE   3322471   1/1985
EP   0379671   8/1990
(Continued)

OTHER PUBLICATIONS

International Search Report dated Apr. 17, 2018 in Application No. PCT/GB17/053409.
(Continued)

*Primary Examiner* — Khanh V Nguyen
*Assistant Examiner* — Khiem D Nguyen
(74) *Attorney, Agent, or Firm* — Niels Haun; Dann, Dorfman, Herrell & Skillman, P.C.

(57) ABSTRACT

A capacitive trans-impedance amplifier comprising a voltage amplifier having an inverting input terminal for connection to an input current source. A feed-back capacitor is coupled between the inverting input terminal and the output terminal to accumulate charges received from the input current source and to generate a feed-back voltage accordingly. A calibration unit includes a calibration capacitor electrically coupled, via a calibration switch, to the inverting input terminal and electrically coupled to the feed-back capacitor. The calibration unit is operable to switch the calibration switch to a calibration state permitting a discharge of a quantity of charge from the calibration capacitor to the feed-back capacitor. The capacitive trans-impedance
(Continued)

amplifier is arranged to determine a voltage generated across the feed-back capacitor while the calibration switch is in the calibration state and to determine a capacitance value (C=Q/V) for the feed-back capacitor according to the value of the generated voltage (V) and the quantity of charge (Q).

19 Claims, 9 Drawing Sheets

(51) Int. Cl.
    *H03F 1/08*     (2006.01)
    *H03F 1/34*     (2006.01)
    *H03F 3/45*     (2006.01)
    *H03F 1/30*     (2006.01)
    *H03F 3/70*     (2006.01)

(52) U.S. Cl.
    CPC ..... *H03F 3/45071* (2013.01); *H03F 3/45475* (2013.01); *H03F 3/70* (2013.01); *H03F 2200/126* (2013.01); *H03F 2200/129* (2013.01); *H03F 2200/321* (2013.01); *H03F 2200/471* (2013.01); *H03F 2203/45116* (2013.01); *H03F 2203/45512* (2013.01); *H03F 2203/45536* (2013.01)

(58) Field of Classification Search
    CPC ........... H03F 3/45071; H03F 2200/126; H03F 2200/129; H03F 2200/321; H03F 2200/471; H03F 2203/45116; H03F 2203/45512; H03F 2203/45536; G01T 1/17; G01T 7/005
    USPC .............................................. 330/9, 51, 308
    See application file for complete search history.

(56) References Cited

U.S. PATENT DOCUMENTS

| | | |
|---|---|---|
| 5,252,928 A | 10/1993 | Giorgetta |
| 5,347,231 A | 9/1994 | Bertuccio |
| 5,770,956 A | 6/1998 | Rolff |
| 6,351,283 B1 | 2/2002 | Liu |
| 6,437,342 B2 | 8/2002 | Johnson |
| 6,809,313 B1 | 10/2004 | Gresham |
| 2002/0153957 A1 | 10/2002 | Jordanov |
| 2013/0068959 A1 | 3/2013 | Suzuki |
| 2015/0362541 A1 | 12/2015 | Peng |

FOREIGN PATENT DOCUMENTS

| | | |
|---|---|---|
| EP | 0986250 | 3/2000 |
| JP | S63201586 | 8/1988 |
| WO | 2013177976 | 12/2013 |
| WO | 2014045223 | 3/2014 |

OTHER PUBLICATIONS

UK Search Report dated Jul. 20, 2017 in Application No. GB1704236.7.
UK Examintion Report dated Dec. 8, 2017 in Application No. GB1704236.7.
UK Examination Report dated Feb. 15, 2019 in Application No. GB1704236.7.
International Search Report dated Jan. 30, 2018 in Application No. PCT/GB17/053408.
Ciccarella et al.; Multichannel 65 zF rms Resolution CMOS Monolithic Capacitive Sensor for Counting Single Micrometer-Sized Airborne Particles on Chip; IREE Journal of Solid State Circuits; vol. 51, No. 11; Nov. 2016; pp. 2545-2553.
UK Search Report dated Jul. 20, 2017 in Application No. GB1704237.5.

US 11,232,937 B2

AMPLIFIER

PRIORITY APPLICATIONS

This application is a 371 application of International Application No. PCT/GB2017/053408 filed Nov. 10, 2017, which claims priority to United Kingdom Patent Application No. 1704237.5 filed Mar. 16, 2017 and United Kingdom Patent Application No. 1704236.7 filed Mar. 16, 2017. Each of the foregoing applications is hereby incorporated herein by reference.

FIELD

The invention relates to amplifiers. In particular, though not exclusively, the invention relates to capacitive trans-impedance amplifiers for amplifying detection signals generated by particle detectors or counters, such as charged-particle detectors/counters e.g. ion beam current measurement devices for mass spectrometers, electron counters, or photon counters e.g. for photometers, or the like. The invention may provide an electrometer incorporating such an amplifier. The invention may be used to amplify the current output of, photo multiplier tubes, or photo detectors etc.

BACKGROUND

Mass spectrometers require the highest possible sensitivity and precision in order to provide accurate mass spectrometry. This requirement becomes ever more acute in view of the increasing trend to extract higher quality data from smaller amounts of sample. This may arise because only very limited quantities of sample are available, or because available samples contain very low concentrations of an element of interest. These circumstances inevitably lead to mass spectrometry being conducted using low or very low signals with the consequent need for increased precision and accuracy. The same can also be said of photometers required to detect very low photon-count signals.

Ultimately, precision and accuracy in a mass spectrometer is inevitably limited by the precision of the ion detection system employed. A dominant factor, which places significant limitations on the precision of low-signal ion detection systems, is noise present within signals. That is to say, as the magnitude of a detected signal approaches the magnitude of underlying noise within the detection system, the signal-to-noise ratio falls, and accuracy and precision suffer. While there may be potentially many sources of noise in an ion detection system, a significant source of noise becomes apparent when one considers the principles upon which ion detection systems are currently based.

FIGS. 1A and 1B schematically illustrate an example of a mass spectrometer (FIG. 1A), and the core elements of an ion detection system commonly used in mass spectrometers (FIG. 1B). In particular, FIG. 1A illustrates an example of a Nier-type mass spectrometer, as developed by Alfred O. Nier in the 1940s, and still widely used to this day. It is to be noted that this type of mass spectrometer is merely one example of a type of mass spectrometer, and the following discussion is not intended to limit the principles being discussed. The mass spectrometer comprises a source of ions (2) arranged in communication with an evacuated ion conduit (3) arranged to accept ions output from the ion source on an initially linear trajectory which intersects the magnetic field produced by a magnet (4) and is consequently redirected electromagnetically along a curved trajectory whilst in the presence of the magnet. Upon exiting the influence of the magnet, the ion path (5) resumes a linear trajectory terminating at an ion detector (6). As will be well known to those skilled in the art, the radius of curvature of the curved portion of the ion path, whilst in the presence of the magnet (4), is dependent on the mass-to-charge ratio (m/q) of the ions in question. Consequently, the angular displacement of the ion path (5) is indicative of the mass-to-charge ratio of the ion in question.

FIG. 1B schematically illustrates the core elements of the ion detector (6) of the mass spectrometer of FIG. 1A. A Faraday cup (7) is arranged in communication with the terminal end of the evacuated ion conduit so as to directly receive ions from the ion source (2) which have traversed an ion path of a selected angular displacement (i.e. selected mass-to-charge ratio). The Faraday cup is a conductive (typically metallic) cup or conduit (or simply a plate) designed to catch charged particles within the vacuum of the ion conduit (3). When a charged particle reaches the conductive inner surface of the Faraday cup, the material of the Faraday cup gains a small net charge while the received ion is neutralised. The conductive material of the Faraday cup may then be discharged in order to measure a small current equivalent to the number of impinging charged particles. In this way, whereas charged particles (e.g. ions) traversing an ion path (5) provide an initial particle current, it is the induced current of electrons in the conductive material of the Faraday cup which provides the subsequent, continued current of charge carriers which is in direct proportion to the initial particle current. By measuring the electric current (I) emanating from the Faraday cup, that is to say the number (N) of electrons (charge e−) flowing from or into (i.e. in the case of positive ions received) the Faraday cup per unit of time (t), one may determine/count the number of ions received by the Faraday cup over that period:

$$N = \frac{I \times t}{e} \qquad \text{eq. (1)}$$

However, the number (N) of electrons flowing, per unit of time, may be exceptionally low. In order to amplify this exceptionally low current, the detector employs a trans-resistance amplifier, which is often referred to as a trans-impedance amplifier, (for current-to-voltage conversion: "trans-impedance") comprising an operational amplifier unit (8) having its positive input terminal (9) connected to ground, and having its inverting input (10) connected in a negative feed-back loop to its output terminal (12) via a resistor (11). This circuit serves to amplify the exceptionally low current (I) by ensuring that the value (R) of the resistor (11) is exceptionally high. In an ideal case, the amplifier will amplify the input current (I) and convert it into a low impedance output voltage (V) in accordance with the equation:

$$V = -I \times R \qquad \text{eq. (2)}$$

Since the exceptionally small currents may be of the order of pico amps or smaller, the value of the resistance (R) may typically be of the order of $10^{12}$ to $10^{13}$ ohms. Consequently, a voltage drop across the feedback resistor (11) may be of the order of milliVolts. When a very small input current (I) is being measured, a very small current flows through the feedback resistor (R) and produces a small voltage drop across that resistor, driving the negative input terminal (inverting input) of the operational amplifier (8). Consequently the output voltage (V) changes in response to the input signal current (I). This arrangement has the effect of driving the voltage at the inverting input of the operational amplifier unit (10) to 0 (zero) Volts.

When measuring small currents, generated by the detection of small ion beams for example, the inherent electrical noise of the feedback resistor (11) employed in this amplifier design, becomes a very significant factor of error limiting the measurement precision of the detector unit (6). In particular, the Johnson-Nyquist noise of the feedback resistor is caused by blackbody radiation within the conductive material making up the feedback resistor, and is described by the following equation:

$$\Delta V = \sqrt{\frac{4k_B RT}{t_m}} \qquad \text{eq. (3)}$$

Here, $\Delta V$ is the noise (Volts), $k_B$ is Boltzmann's constant, R is the value of the resistor (ohms), T is the temperature of the resistor (Kelvin), and $t_m$ is the integration time (seconds)—namely, the duration of time over which the measured signal is collected. As one can see, the noise level ($\Delta V$) increases as the square root of the resistance value (R) of the resistor (11), whereas the value of the signal itself (V=I×R) increases in direct proportion to the resistance value of the resistor. Thus, the signal-to-noise ratio (S/N) varies as the square root of the resistance value of the resistor (11):

$$S/N = \frac{V}{\Delta V} \propto \frac{R}{\sqrt{R}} \propto \sqrt{R} \qquad \text{eq. (4)}$$

By increasing the resistance value of the feedback resistor 100 fold, for example, the signal-to-noise ratio may be improved by a factor of 10. This has fuelled competition, within the industry, to provide amplifiers with feedback resistors having ever larger resistance values (R). However, a direct consequence of larger resistance values is a reduction in the responsiveness of the amplifier and, as a result, the versatility of the mass spectrometer apparatus within which it is used. For example, in practice, in order to correct for detector noise, one would subtract a "baseline" signal value from a "raw" signal value when taking ion-count signals from a raw sample data signal in order to remove the noise component, and thereby revealed the "pure" signal value. The baseline signal is the detector output result in the absence of an input signal (i.e. no ions) and, therefore, is attributable to detector noise. Ideally, such a baseline measurement is repeated at regular intervals in between successive measurement periods (e.g. several tens of seconds each). In order to make this repeated baseline measurement procedure viable, it is desirable that the amplifier apparatus is sufficiently responsive to removal of the ion signal (i.e. whereby ions no longer impinge upon the Faraday cup), in the sense that the detected output signal (V) of the operational amplifier attains a value of 0 V as soon as the current of ions impinging upon the Faraday cup is reduced to zero. This means that any remaining output signal (12) produced by the operational amplifier can be confidently assumed to be solely the result of noise this is the baseline one desires to measure.

However, unfortunately, the amplifier does not respond immediately to removal of the ion current, and will continue to produce a non-zero output voltage signal (12) for an extended period of time after complete removal of an input ion signal at the Faraday cup (7). The output signal of the amplifier slowly decays exponentially over time ultimately reaching a value representing the baseline noise signal. Unfortunately, this decay time can be of the order of minutes in duration, and increases in duration as the resistance value (R) of the feedback resistor (11) is increased. This decay time is due to the dielectric behaviour of materials in the amplifier including that of the resistor substrate, printed circuit board, semiconductor packaging and other insulators essential in the physical construction. Conventional designs minimise this unwanted signal by the use of guard rings and layout to reduce the amount of dielectric material. Often schemes to insert predictive correction signals know as Tau correction are deployed with varying degrees of success.

In this way, there exist, in effect, a conflict between the need to increase the resistance value of the feedback resistor in trans-impedance amplifiers in order to improve the signal-to-noise ratio, and the need to reduce the response time of the operational amplifier in order to make the detector more responsive and versatile.

An amplifier desirably has a large 'Dynamic Range'. This may be defined as the ratio of the maximum output voltage ($V_{OutMax}$) to the smallest output voltage ($V_{OutMin}$) that the amplifier can measure within the limits of amplifier noise. This may be expressed in decibels using the following formula:

$$DynamicRange = 20\log_{10}\left(\frac{V_{OutMax}}{V_{OutMin}}\right) \qquad \text{eq. (5)}$$

Limitations in the dynamic range of the operational amplifier unit (8) in the detector (6) place upper and lower limits upon the size of an ion current, incident at the Faraday cup (7) of the detector, that the detector is able to provide an accurate and reliable detection output voltage signal (V) for, at the amplifier output (12). If the ion current is too high, then the voltage dropped across the feedback resistor (11) will exceed $V_{OutMax}$ and the amplifier cannot be used. Conversely, If the ion current is too low, then the voltage dropped across the feedback resistor (11) will be less than $V_{OutMin}$ and, once more, the amplifier cannot be used. In fact, it is common practice to have available several different detectors (6), each containing an operational amplifier having a dynamic range best suited to the ion current level which the user intends to measure at a particular time. The user may wish to measure a large ion current initially, necessitating the use of a first detector unit containing an operational amplifier having a dynamic range centred ($V_{centre}$) at an appropriate voltage $V_{OutMin} < V_{centre} < V_{OutMax}$, and then may wish to measure a much lower ion current subsequently, during the same experiment/measurement, necessitating the use of a second detector containing an operational amplifier having a dynamic range centred at a much lower voltage and outside of the dynamic range of the first detector. For example, this may occur as the quantity of sample being measured depletes during the course of a measurement or experiment. The stability or 'drift' of measurement amplifiers is a limiting factor in many applications. In conventional trans-impedance amplifiers baseline drift arises from a number of sources. Because the measurement is in the voltage domain only, voltage drift of semiconductors, dielectrics and other components of the signal chain impose errors on the measured signal that are difficult to remove.

Various methods are adopted to minimise drift such as temperature control, operation in a vacuum and recurrent calibration.

This state of affairs is highly undesirable. The invention addresses these deficiencies in the prior art.

SUMMARY

At its most general, the invention is in the use of a capacitor (or system of capacitors, as appropriate) to serve as the principal impedance in a negative feed-back loop in a voltage amplifier component of a trans-impedance amplifier and actively controlling the amount of charge within the capacitor appropriately to improve the responsiveness and/or dynamic range of the amplifier. This represents something of a paradigm-shift in the sense that established practice in the mass-spectrometry art is to passively use resistor-based feed-back loops in trans-impedance amplifiers and to push to ever larger resistance values to achieve gains in sensitivity. The driving principle, according to this practice, is to convert ever-smaller signal currents into detectable voltage signals by passively passing those currents through ever larger feed-back resistors of voltage amplifiers. A direct conversion from current to voltage, according to Ohm's Law, is the accepted rule/practice underpinning this convention. However, the present invention departs from this long-established convention and does not rely on the principles of Ohm's Law. The present invention may allow one to accumulate signal charges and to perform particle counting, or measurement of particle current, by determining the rate of charge accumulation (i.e. a current) at the feed-back capacitor. In this way, the invention provides an amplifier for use in measurement of particle current, and for amplifying detection signals generated by particle detectors, such as suitable for mass spectrometry applications, and/or such as ion current measurement devices for mass spectrometers, electron detectors, or photo-detectors e.g. for photometers, or the like. The invention may be used to amplify the current output of an ion detector for/in a mass spectrometer, photo multiplier tubes, or photo-detectors etc.

It has been found that using capacitive impedance instead of resistive impedance provides a reduction in noise as compared to the Johnson-Nyquist noise generated by a feedback resistor, and caused by blackbody radiation within the conductive material making up the feedback resistor. Furthermore, the polarisation relaxation effects/processes occurring within the dielectric materials of very high-resistance feed-back resistors, which causes the slow decay rate (low responsivity) in resistor-based trans-impedance amplifiers, may be effectively absent when a feed-back capacitor is used in a manner according to the invention. This renders the capacitive trans-impedance amplifier very responsive indeed and allows the amplifier to be more versatile.

Parasitic capacitances which disrupt measurement in a resistive (trans-resistance) amplifier have been found to have negligible, or very little, effect on the capacitive circuit of the trans-impedance amplifier of the invention. While parasitic capacitance is still present, it simply, in effect, becomes a part of the measuring element. The inventors have discovered that it is more practical to design a trans-capacitive amplifier where the parasitic resistances are so large that they are insignificant, than it is to design a trans-resistive amplifier where the parasitic capacitances are small enough that they are insignificant.

In a first of its aspects, the invention may provide a capacitive trans-impedance amplifier comprising: a voltage amplifier having an inverting input terminal for connection to an input current source, and a non-inverting input terminal, the voltage amplifier being arranged to provide at an output terminal thereof an output voltage signal; a feed-back capacitor coupled between the inverting input terminal and the output terminal to accumulate charges received from the input current source and to generate a feed-back voltage accordingly wherein the capacitor defines a negative feed-back loop of the voltage amplifier such that the output voltage is proportional to said accumulation of said charges; a calibration unit including a calibration capacitor electrically coupled, via a calibration switch, to said inverting input terminal of said voltage amplifier and thereby electrically coupled to said feed-back capacitor, wherein the calibration unit is operable to switch the calibration switch to a calibration state permitting a discharge of a quantity of charge (e.g. predetermined) from the calibration capacitor to the feed-back capacitor, wherein the capacitive trans-impedance amplifier is arranged to determine a voltage generated across said feed-back capacitor while said calibration switch is in said calibration state and to determine a capacitance value (e.g. via C=Q/V) for the feed-back capacitor according to the value of the generated voltage (V) and the quantity of charge (Q).

The calibration switch may comprise a photodiode operable to attain said calibration state in responsive to receipt of optical radiation sufficient to render the photodiode conductive.

The capacitive trans-impedance amplifier may comprise a calibration circuit including a plurality of capacitive trans-impedance amplifiers each according to the arrangement described above. Each amplifier may comprise a main amplifier part including a voltage amplifier, a feedback capacitor, an analyser/control units/circuitry for controlling the operation of the apparatus. Each amplifier may include a respective Faraday cup/plate, and a respective calibration switch controlled by a calibration control signal provided by the control unit of the respective main amplifier. The calibration circuit may include a collective feedback calibration capability. The calibration circuit may form a part of e.g. a mass spectrometer, comprising several Faraday cups/plates, each with their own capacitive trans-impedance amplifier. Of course, the circuit is applicable to other applications than mass spectrometers, in which case the Faraday cups would be replaced by another current source, such as a photo-detector in photometry/imaging applications.

The capacitive trans-impedance amplifier may include a calibration unit including a calibration capacitor of known capacitance $C_{cal}$, which is electrically coupled, via the calibration switch, to the junction of the inverting input terminal of the voltage amplifier and the feed-back capacitor. This thereby may electrically couple the calibration switch to the feed-back capacitor. The calibration unit may be operable to switch the calibration switch to a calibration state permitting a discharge of a predetermined charge ($Q_{cal}$) from the calibration capacitor into the feed-back capacitor. An analyser unit may also be arranged to determine, as a consequence of this controlled charge injection, a voltage ($\Delta V_{cal}$) generated across the feed-back capacitor and to determine a capacitance value ($C=\Delta Q_{cal}/\Delta V_{cal}$) for the feed-back capacitor according to the value of the generated voltage ($\Delta V_{cal}$) and the predetermined charge ($\Delta Q_{cal}$). In this way, a controlled and pre-defined quantity of charge ($\Delta Q_{cal}$) may be injected from the calibration capacitor into the feed-back capacitor, and measuring the change in voltage ($\Delta V_{cal}$) across the feed-back capacitor resulting from this charge injection, the analyser unit may calculate the capacitance of the feed-back capacitor. The feedback capacitor may or may not be fully discharged by the switch prior to this calibration sequence. It is not necessary to fully disconnect the current source (e.g. Faraday cup) from the feedback capacitor at that time.

The calibration switch may comprise a p-n photodiode that converts incident light into current when photons are absorbed in the photodiode. An LED light source may be arranged adjacent the photodiode switch and may be operatively connected to the calibration unit to receive illumination signals to which the LED is responsive to illuminate the photodiode with light of intensity sufficient to cause it to conduct and generate the charge carriers. Thus, the photodiode may be arranged to generate an output of charge carriers in response to an illumination applied to the photodiode to change the state (i.e. to switch) the photodiode to a state permitting discharge of charge in the calibration capacitor. The cathode of the photodiode may be connected to a terminal of the calibration capacitor. The anode of the photodiode may be connected to one terminal of the feedback capacitor. Consequently, the anode of the calibration switch may be electrically connected to a "virtual ground" provided at the inverting input of the voltage amplifier to which a terminal of the feed-back capacitor is concurrently connected. In other preferred embodiments, pairs of amplifiers may be connected to a common calibration capacitor (i.e. one calibration capacitor for each pair, with potentially multiple pairs). The method would then be to make a ratiometric calibration as between capacitors of each separate pair. In other embodiments, calibration may be done with resect to an absolute reference capacitance. The terminal of the calibration capacitor not connected to the calibration switch may be electrically coupled to earth/ground. With this arrangement, by applying an illumination signal to the LED the calibration unit is able to inject a controlled quantity of charge into the feed-back capacitor. The calibration unit may be communicatively connected to an analyser unit and the calibration unit may be arranged to communicate the value of the predetermined quantity of charge ($\Delta Q_{cal}$) to the analyser unit. The analyser unit may be arranged to determine a value for the capacitance (C) of the feedback capacitor by monitoring a corresponding change $\Delta V_{cal}$ in the output voltage signal received by it from the voltage amplifier as a consequence of this calibration charge injection procedure, according to the following equation:

$C = \Delta Q_{cal}/\Delta V_{cal}$

With this calculated value of capacitance for the feedback capacitor, the analyser unit may be arranged to determine a value representative of the rate of arrival of ions/particles received by the Faraday cup ($\Delta N/\Delta t$), and to output of the result.

Each such capacitive trans-impedance amplifier may employ the same, common single calibration capacitor. The common calibration capacitor may be electrically connected to an array of such capacitive trans-impedance amplifiers. The single/common capacitor may be arranged to store a quantity of charge to be distributed to the feed-back capacitors of the array of capacitive trans-impedance amplifiers. Operation of respective calibration switches may permit a transfer of charge from the calibration capacitor to the respective feed-back capacitor. Each of the other calibration switches may comprise a photo-diode and a respective, separate light source (e.g. LED) which is independently controllable to illuminate the photo-diode to render it conductive.

Operation of the calibration circuit may comprise one or more of the following steps:
(1) Charging the calibration capacitor, and discharging a selected number (e.g. 2 or more, e.g. all) of the feed-back capacitors of the capacitive trans-impedance amplifiers (e.g. to near 0V (zero) or any other desired voltage level;
(2) Measuring the voltages on the outputs of the capacitive trans-impedance amplifiers (corresponding to the selected number of feedback capacitors to be calibrated). An analyser unit, described above, may arranged to implement this operation;
(3) Rendering conductive the respective calibration switches (of the selected number of feedback capacitors) corresponding to each of the capacitive trans-impedance amplifiers being calibrated (e.g. Illuminate photodiodes of the switches, as appropriate). This switching may be done consecutively, one-by-one, or may be done simultaneously in respect of two or more of, or all of, the selected number of feedback capacitors. A control unit (discussed above) may be arranged to implement this operation;
(5) Rendering the relevant calibration switches non-conductive (e.g. switch off the illumination of the photodiodes of the switches, as appropriate). A control unit may be arranged to implement this operation;
(6) Measuring the voltages on the outputs of each of the capacitive trans-impedance amplifiers being calibrated. An analyser unit may be arranged to implement this operation;
(8) Calibrating the feedback capacitor of each capacitive trans-impedance amplifier, against the calibration capacitor using the following formula:

$$C_n = C_{calibration} \frac{\Delta V_{calibration}}{-\Delta V_n}$$

In this equation: $C_n$ is the capacitance of the calibrated capacitor; $C_{calibration}$ is the capacitance of the calibration capacitor; $\Delta V_{calibration}$ is the measured voltage difference between final and initial voltages on the output of a selected one (any one) of the amplifiers designated as the reference/calibration amplifier; $\Delta V_n$ is the measured voltage difference between final and initial voltages on the output of the calibrated amplifier. Note that $\Delta V_{calibration}$ and $\Delta V_n$ will have opposite polarity.

In the/each amplifier, a feed-back capacitor is coupled between the inverting input terminal and the output terminal to accumulate charges received at, or received from, the input current source and to generate a feed-back voltage accordingly. The capacitor defines a negative feed-back loop of the voltage amplifier such that the output voltage is proportional to the accumulation of said charges. A reset switch may be electrically coupled to the inverting input terminal of the voltage amplifier and electrically isolated from the output terminal of the voltage amplifier. The reset switch may be switchable to a state permitting a transfer of charge from the capacitor, or to the capacitor. The reset switch is preferably operable to 'reset' the charge/voltage on the feedback capacitor, as desired. This arrangement decouples the structure of the reset switch from the output port of the voltage amplifier, and so avoids the undesirable effects of leakage currents and/or interfering voltage signals emanating from the reset switch structure and being felt at the output port. The amplifier output signal is thereby rendered far less 'noisy'. If the reset switch were simply to be arranged in parallel across the terminals of the feedback capacitor, this would cause the voltage of the feedback capacitor to be applied across the terminals of the reset switch when the switch was in the 'open' state. Leakage currents may pass through the 'open' switch due to defects/limitations in the reset switch design which may be exposed by the voltage of the feedback capacitor. These reduce the accuracy of the amplifier output signal. A benefit of making the reset switch independent of the output voltage is that, when the reset switch is not in use, it can be made to have the same voltage at each end. This voltage may be zero or another voltage, as described. Because the reset switch nominally has zero volts applied across it during the measurement phase, any leakage or noise due to the reset switch will be very small.

The reset switch, by being electrically coupled to the inverting input, may be switchable to a state permitting a discharge of at least some of the accumulated charge from the feed-back capacitor, or an injection of charge therein. The reset switch may comprise a diode, such as a p-n diode, and may comprise a semiconductor device with non-linear conductivity (e.g. exponentially increasing) in response to a linear increase in a voltage applied thereto in forward bias. The diode may be arranged to generate an output (i.e. charge carriers) at one terminal thereof in response to a voltage applied to the other terminal thereof, to change the state (i.e. to switch) the diode to a state permitting discharge of accumulated charge in the feed-back capacitor, or an injection of charge therein. For example, the diode may be switchable to a state in which it generates negatively-charged charge carriers (i.e. electrons) at a terminal of the diode in electrical connection with the feed-back capacitor thereby to permit positive charge (i.e. a depletion of electrons) accumulated by the feed-back capacitor to discharge to neutralise the negatively-charged charge carriers of the diode switch, or to inject the negative charge carriers into the feedback capacitor to neutralise positive charge accumulated there.

When the amplifier is connected to a source of positively-charged particles, e.g. a Faraday cup/plate, and positively-charged particles are received by the cup/plate, this would cause a positive charge to accumulate on the terminal of the feed-back capacitor connected to the Faraday cup/plate (i.e. electrons removed to neutralise the positively-charged particles received at the Faraday cup/plate. The terminal of the capacitor connected to the Faraday cup/plate becomes, in effect, an anode. To 'discharge' the positive charge accumulated at the anode of the capacitor, one notionally allows the positive charge to flow from the capacitor through the diode (e.g. inject electrons from the diode switch). An anode of the diode may be connected to an anode of the feed-back capacitor. One may use the amplifier to detect/amplify signals generated by receipt of negatively-charged particles (e.g. electrons). A cathode of the diode may be connected to the feed-back capacitor (e.g. reverse bias). The reset switch may comprise two diodes arranged in parallel, with the anode of each connected in parallel to the cathode of the other, to allow current to flow in either direction through the reset switch to/from the feedback capacitor, depending on the polarity of the detected particles and, therefore, of the voltage at the feedback capacitor.

Thus, the reset switch may comprise a semiconductor device (e.g. a semiconductor diode) switchable to generate at a terminal thereof, which is electrically coupled to the inverting input, an electrical charge having a polarity opposite to that of the accumulated charge, thereby permitting the discharge, or injection, of accumulated charge to neutralise the electrical charge generated, via the reset switch.

The switching of the reset switch, when a semiconductor switch, may be implemented by applying a voltage to the semiconductor switch to change the state of the reset switch from a non-conducting state to a conducting state thereby permitting a flow of charge carriers therethrough, to put effect to the discharge of accumulated charge on the feedback capacitor, or injection of charge therein.

The non-inverting input terminal may be electrically coupled to a target voltage ($V_{target}$) of any desired value. This target voltage may be set to ground (i.e. held at zero volts), or may be set to a non-zero voltage value. The value of the target voltage determines the operating voltage at/to which the input current source may be driven (e.g., the operating voltage of a Faraday Cup).

The voltage amplifier may comprise an operational amplifier, or differential amplifier, or inverting amplifier, or combination of several amplifiers made of discrete or integrated circuits, e.g. a discrete transistor or low noise preamplifier may be used as an input stage followed by a voltage amplifier. It would be possible to replace the amplifier with an arrangement of an A/D converter input, a D/A converter output, and a digital processor between them for processing input signals to simulate the behaviour of the amplifier. This is not a dissimilar principal to the 'direct conversion' radio receivers that are now commonplace. Accordingly, in an aspect, the invention may provide a capacitive trans-impedance amplifier as described above, comprising: an analogue-to-digital (A/D) signal converter for connection to an input current source to receive therefrom electrical charges and for producing an input digital signal representative of charge so received; a computer processor connected to the analogue-to-digital (A/D) signal converter arranged to receive said input digital signal and to process the input digital signal according to a digital simulation to generate an output digital signal; a digital-to-analogue (D/A) signal converter arranged to receive the output digital signal and to generate therefrom an output voltage signal; wherein the digital simulation is arranged to simulate the output result from the capacitive trans-impedance amplifier described above, resulting from an input thereto of said received electrical charge.

In a related aspect, the invention may provide a method of capacitive trans-impedance amplification comprising: providing an analogue-to-digital (A/D) signal converter connected to an input current source to receive therefrom electrical charges and therewith producing an input digital signal representative of charge so received; providing a computer processor connected to the analogue-to-digital (A/D) signal converter to receive said input digital signal and therewith processing the input digital signal according to a digital simulation to generate an output digital signal; providing a digital-to-analogue (D/A) signal converter to receive the output digital signal and to generate therefrom an output voltage signal; wherein the digital simulation simulates the output result from the capacitive trans-impedance amplifier according to the invention described above resulting from an input thereto of said received electrical charge. The invention, in another aspect, may provide a computer program or computer program product (e.g. the program stored on computer, or a storage medium) comprising a computer program arranged to implement the digital simulation, when executed by a computer processor.

The capacitive trans-impedance amplifier may include a controller unit arranged to monitor a voltage across the feed-back capacitor acquired from the accumulated charge, and to control the reset switch to permit the discharge of accumulated charge when the acquired voltage rises above a first threshold voltage value which lies within the dynamic range of the voltage amplifier. For example, the controller unit may be arranged to apply a voltage pulse to a terminal of the switch, when a semiconductor switch, other than the terminal electrically connected to the feedback capacitor, for a desired period of time sufficient to allow discharge of accumulated charge from the feedback capacitor whilst the semiconductor switch is maintained in the conductive state by virtue of the applied voltage pulse. For example, if the semiconductor switch is a diode, the voltage pulse may be applied to place the diode in a conductive state in forward bias.

Most preferably the terminal of the reset switch which is connected to the feedback capacitor is electrically connected to the inverting input of the voltage amplifier to which a terminal of the feedback capacitor is concurrently connected. The inverting input of the voltage amplifier is most preferably held that "virtual ground", by virtue of the negative feedback loop. Thus, preferably, the other terminal of the reset switch (when a semiconductor switch, such as a diode) is most preferably held at "ground" voltage, or thereabouts sufficient to maintain the reset switch in a non-conducting state, when it is desirable to achieve this result. The controller unit may be arranged to controllably apply a drive voltage pulse to the other terminal of the reset switch as and when desired, having the appropriate polarity and magnitude to render the reset switch conductive.

The controller unit may be arranged to control the reset switch to permit discharge of the feedback capacitor for a period of time which may be selected as desired, but preferable examples are a period of time equal to or less than about 1000 μs, or equal to or less than about 500 μs, or equal to or less than about 100 μs, or equal to or less than about 10 μs. The reset switch may operate/switch in this way for a period of about 400 μs but this could vary over a wide range depending on the time taken for the capacitor to stabilise. It may be 1 μs or less but typically could be longer, optionally much longer.

The controller unit may be arranged to control the reset switch to prevent discharge of the feedback capacitor for a period of time (e.g. a measurement (integration) time) which may be selected as desired, and depending on the particular application or measurement at hand, but examples are a period of time equal to about 100 μs, or a few hundred microseconds, or more. In general mass-spectrometry applications, for example, the measurement (integration) time may generally be in the range from about 10 ms to hundreds or even thousands of seconds.

The controller unit may be arranged to control the reset switch to permit discharge of the feedback capacitor periodically or intermittently, whereby relatively shorter periods of time during which discharge is permitted are separated by relatively longer periods of time in which discharge is prevented and charge is accumulated (or re-accumulated) by the feedback capacitor.

The reset switch may be switchable between a first state permitting the discharge of accumulated charge and a second state which does not permit the discharge of accumulated charge, wherein the controller unit is arranged to monitor a voltage across the feed-back capacitor while the reset switch is in the first state, and to control the reset switch to achieve the second state when the monitored voltage falls below a second threshold voltage value which lies within the dynamic range of the voltage amplifier. In this way, the controller unit is able to control the amount of charge accumulated on the feed-back capacitor such that the corresponding voltage upon the feed-back capacitor does not exceed the maximum desired voltage appropriate to the voltage amplifier, and may also control the amount charge retained by the feed-back capacitor at the end of a discharge event, such that the corresponding voltage upon the feed-back capacitor does not fall below the minimum desired voltage appropriate to the voltage amplifier. In this way, the voltage across the feed-back capacitor may be controlled to lie within an optimal, or at least an appropriate range of values which enable the voltage amplifier to work optimally, or at least most appropriately. For example, desirably the feedback capacitor voltage is controlled to remain within the dynamic range of the voltage amplifier and thereby avoid saturation of the voltage amplifier, or other performance degradation which may occur due to inappropriate voltage upon the feed-back capacitor.

In this way, the capacitive trans-impedance amplifier of the present invention, in preferred embodiments, is able to be adapted to amplify a very broad range of input signal intensities/strengths corresponding to a very wide range of, for example, different ion signal strengths received at a Faraday cup of a mass spectrometer. To illustrate this point, consider a situation in which a very weak ion signal is incident upon the Faraday cup. This will result in a very low current signal, or charge accumulation rate, at the feedback capacitor of the capacitive trans-impedance amplifier. Accordingly, relatively long integration times are appropriate to such a measurement in order that an accurate ion counter signal may be derived. The rate of increase of the voltage at the feed-back capacitor is, accordingly, relatively low in such a circumstance which means that a long integration time is possible without the feed-back capacitor voltage exceeding the dynamic range of the voltage amplifier.

Consider now a very different situation in which a very strong ion signal is incident upon the Faraday cup. This will result in a relatively much higher current signal, or charge accumulation rate, at the feedback capacitor of the capacitive trans-impedance amplifier. Accordingly, relatively short integration times would normally be considered appropriate to such a measurement since one would expect the voltage across the feedback capacitor to rapidly reach the upper limit of the dynamic range of the voltage amplifier. However, a particular advantage of the present invention comes from the fact that an arbitrarily long integration time can be used even with a high current signal/ion signal because the voltage at the feed-back capacitor is able to be rapidly discharged before/as it approaches the upper limit of the dynamic range of the voltage amplifier, and is rapidly reduced to a suitable low value within that dynamic range. As soon as that suitably low voltage value is achieved, charge accumulation can resume and integration of the ion signal continues. In this way, a high ion-count signal can be accommodated by accumulating charge across the feed-back capacitor in a piecemeal fashion without requiring termination of the measurement. This enables very high and very low ion-count signal strengths to be handled by the self-same capacitive trans-impedance amplifier. Dynamic range is significantly increased. In a resistive trans-impedance amplifier, the range is limited by voltage noise which is the sum of resistor noise and amplifier noise. Typically, this restricts the range to around four orders of magnitude. In the capacitive trans-impedance of the invention, amplifier resistor noise is removed reducing baseline noise typically from mV to pV. This reduction of noise, by three orders of magnitude, increases the useful range to around ten orders of magnitude. Further noise reduction arises from moving an element of the measurement, according to preferred embodiments of the invention, from the voltage domain to the time domain.

The capacitive trans-impedance amplifier may include an analyser unit arranged to determine a rate of change of voltage across the feed-back capacitor resulting from said accumulation of charge, and to generate a current value representing a current received by the capacitive trans-impedance amplifier from a said input current source. For example, when the current source derives its current by the collection of charged particles (e.g. ions), or by the arrival of particles inducing charge carriers at the current source (e.g. photons), then by measuring the electric current (I) emanating from the current source (e.g. Faraday cup), that is to say the number (N) of charge carriers (charge e) flowing from the source per unit of time (t), one may determine/count the number of ions/particles received by the current source (e.g. Faraday cup) over that period. For example, a change $\Delta Q$ in the charge accumulated by the feed-back capacitor having a capacitance C, is equivalent to $C \times \Delta V$. Thus, the electrical current supplied to the feed-back capacitor is simply the rate of change of accumulated charge (i.e. the rate of arrival of ions/particles received by the current source) and is derivable from the rate of change of the voltage (V) across the feed-back capacitor as follows:

$$\frac{\Delta Q}{\Delta t} = C \frac{\Delta V}{\Delta t} = I \quad \text{eq. (6)}$$

The analyser unit may be arranged to calculate the rate of change of voltage across the feed-back capacitor, and to derive therefrom a value representative of the electrical current (I) supplied to the feed-back capacitor. The analyser unit may be arranged to determine a value representative of the rate of arrival of ions/particles received by the current source, using the derived value (I) representative of the electrical current supplied to the feed-back capacitor. This arrival rate may, for example, be determined by multiplying together the calculated value ($\Delta V/\Delta t$) of the rate of change of the voltage of the feed-back capacitor and the value (C) of the capacitance of the feed-back capacitor. The value of the capacitance of the feed-back capacitor may be predetermined by prior measurement, or may be determined directly by a feed-back capacitor calibration process as follows.

The capacitive trans-impedance amplifier may employ the aforesaid calibration unit including a calibration capacitor electrically coupled, via a calibration switch, to the inverting input terminal of the voltage amplifier and thereby electrically coupled to the feed-back capacitor. The calibration unit is operable to switch the calibration switch to a calibration state permitting a discharge of a predetermined charge from the calibration capacitor to the feed-back capacitor, wherein the capacitive trans-impedance amplifier (e.g. the analyser unit thereof) is arranged to determine a voltage generated across the feed-back capacitor while the calibration switch is in the calibration state and to determine a capacitance value (C=Q/V) for the feed-back capacitor according to the value of the generated voltage (V) and the predetermined charge (Q). In this way, a controlled and pre-defined quantity of charge may be injected from the calibration capacitor into the feed-back capacitor. By measuring the change in voltage across the feed-back capacitor resulting from this charge injection, the close impedance amplifier (e.g. analyser unit) may calculate the capacitance of the feed-back capacitor.

The calibration switch may comprise a diode, such as a photodiode comprising a semiconductor device that converts incident light into current when photons are absorbed in the photodiode. The photodiode may comprise a p-n photodiode. The photodiode may be arranged to generate an output (i.e. charge carriers) in response to an illumination applied to the photodiode to change the state (i.e. to switch) the photodiode to a state permitting discharge of charge in the calibration capacitor. Preferably the cathode of the calibration switch, when a photodiode, is connected one terminal of the calibration capacitor, and the anode of the calibration switch is connected to one terminal of the feed-back capacitor. Preferably the anode of the calibration switch is electrically connected to a "virtual ground" provided at the inverting input of the voltage amplifier to which a terminal of the feed-back capacitor is concurrently connected. The terminal of the calibration capacitor not connected to the calibration switch may be electrically coupled to "ground". The calibration unit may comprise a light source, such as a light-emitting diode (LED), operable and arranged to illuminate the photodiode under the control of the calibration unit. In this way, the calibration switch, when a photodiode, may be controlled to acquire a conducting state by controlling the light source to illuminate the photodiode of the calibration switch thereby permitting the discharging of charge stored in the calibration capacitor, through the photodiode and into the feed-back capacitor. There is no requirement to control the quantity of charge flow through the photodiode by controlling/varying the luminosity of the LED. The photodiode may, in effect, be used as a switch to transfer a fixed quantity of charge into the feed-back capacitor.

An apparatus according to an aspect of the invention e.g. a mass spectrometer, may comprise several Faraday cups, each with their own capacitive trans-impedance amplifier. Each capacitive trans-impedance amplifier may use the same, common calibration capacitor. The same/common calibration capacitor may comprise a single capacitor (e.g. one alone) or may comprise a system of mutually connected capacitors collectively forming an equivalent single, common capacitance. The common calibration capacitor may be electrically connected to an array of capacitive trans-impedance amplifiers, in which each capacitive trans-impedance amplifier has its own respective calibration switch (photodiode). The single/common capacitor may be used to store a quantity of charge which may be would be transferred into (i.e. distributed across/shared) the feed-back capacitors of the capacitive trans-impedance amplifiers. Measurement of the resulting change in voltage across a feed-back capacitor as a fraction/proportion of the change in voltage across the calibration capacitor, permits the capacitance of the feed-back capacitor to be measured as a fraction/proportion of the capacitance of the calibration capacitor. Accordingly, the relative capacitances of the feed-back capacitors, in the array of capacitive trans-impedance amplifiers, may be determined. These relative capacitance values may be used to normalise the output measurements of the amplifiers of the array, in use, to a fixed common reference (i.e. the calibration capacitor). Each calibration switch, of the calibration switches of the array, may have its own respective LED for illuminating the photodiode of the calibration switch (to render it conductive), under the control of the calibration unit, in the manner described above.

The invention may provide a calibration circuit comprising a plurality of capacitive trans-impedance amplifiers, each as described above, in which one of the capacitive trans-impedance amplifiers is a calibration amplifier comprising the aforesaid calibration capacitor arranged as the feed-back capacitor of that trans-impedance amplifier, and wherein the inverting input terminal of the voltage amplifier of the calibration amplifier is connected to the respective inverting input terminal of the voltage amplifier of each of the other capacitive trans-impedance amplifiers via a respective calibration switch thereof. Operation of the respective calibration switches (photodiode, when illuminated) permits a transfer of charge from the calibration capacitor ($C_{calibration}$) to the respective other feed-back capacitors ($C_1$, $C_2$ ... ). Each of the other calibration switches may comprise a respective, separate light source (e.g. LED) which is independently controllable to illuminate the calibration switch to render it conductive. Operation of the calibration circuit may comprise the following steps:

(1) Charge the calibration capacitor, and discharge all of the feed-back capacitors of the capacitive trans-impedance amplifiers to near 0V (zero) or any other desired voltage level (the exact voltage is not important);
(2) Measure the voltages on the outputs of the calibration amplifier and the other capacitive trans-impedance amplifiers (i.e. those being calibrated);
(3) Render conductive the respective calibration switches corresponding to each of the capacitive trans-impedance amplifiers being calibrated (e.g. Illuminate photodiodes of the switches, as appropriate);
(4) Wait until the voltage on the output of the calibration amplifier reaches a settled level (exact value of the final voltage is not important) within the operation range of the amplifier. The rate of voltage change (proportional to current through the calibration switches) is not important;
(5) Render the calibration switches non-conductive (e.g. switch off the illumination of the photodiodes of the switches, as appropriate);
(6) Measure the final voltages on the outputs of the calibration amplifier and each of the capacitive trans-impedance amplifiers being calibrated;
(7) Calibrate the capacitive trans-impedance amplifiers feed-back capacitor against the calibration capacitor using the following formula:

$$C_n = C_{calibration} \frac{\Delta V_{calibration}}{-\Delta V_n}$$

In this equation: $C_n$ is the capacitance of the calibrated capacitor; $C_{calibration}$ is the capacitance of the calibration capacitor; $\Delta V_{calibration}$ is the measured voltage difference between final and initial voltages on the output of the calibration amplifier; $\Delta V_n$ is the measured voltage difference between final and initial voltages on the output of the calibrated amplifier. Note that $\Delta V_{calibration}$ and $\Delta V_n$ will have opposite polarity.

In any aspect of the invention, the capacitive trans-impedance amplifier may comprise a cooler apparatus/unit arranged to cool the voltage amplifier to a temperature falling between 0 (zero) degrees Celsius and −50 degrees Celsius, or between −10 degrees Celsius and −50 degrees Celsius, or between −20 degrees Celsius and −50 degrees Celsius, to reduce thermal noise in the voltage amplifier. It has been found that this greatly enhances the performance of the capacitive trans-impedance amplifier as a whole. Cooling apparatus, suitable for cooling a voltage amplifier (e.g. an operational amplifier), such as would be readily apparent to the skilled person, may be employed to this end. The invention, according to any method described herein, may include a corresponding/equivalent step of cooling the voltage amplifier.

In a second aspect, the invention may provide an ion beam current measurement device comprising a capacitive trans-impedance amplifier as described above. For example, the particle counter may be a counter suitable for use in a mass spectrometer for measuring/counting the number and/or rate of arrival at an ion detector, of ions from an ion source. The invention may be used in sector mass spectrometers, which use electric, magnetic or both fields to separate charged particles. Also it may be used in quadrupole mass analysers or any other mass spectrometer, which requires measurement of ion currents.

The ion beam current measurement device may include a Faraday cup electrically coupled to the inverting input terminal of the voltage amplifier as said current source. In this way, charged ions arriving at the Faraday cup induces an accumulation of charge at the Faraday cup which, in being electrically connected to the inverting input of the voltage amplifier, causes a corresponding accumulation of charge at the terminal of the feed-back capacitor which is also electrically connected to the inverting input of the voltage amplifier. Thus, the rate of accumulation of charge (voltage) at the feed-back capacitor is in direct proportion to the rate of arrival of ions at the Faraday cup.

In a third aspect, the invention may provide a mass spectrometer comprising an ion beam current measurement device as described above.

In a fourth aspect, the invention may provide an electrometer or a photometer comprising a capacitive trans-impedance amplifier as described above. Photometers, produce a small current which is proportional to light intensity, this invention, in some embodiments, may measure small currents over a large range with low noise. The invention is not restricted to applications to single-channel photometrics, for example, x-ray imaging arrays with many channels may employ this technology by integrating a large number of amplifiers onto a single imaging device.

In a fifth aspect, the invention may provide a method of capacitive trans-impedance amplification comprising:

providing a voltage amplifier having an inverting input terminal electrically coupled to an input current source, and a non-inverting input terminal, the voltage amplifier being arranged to provide an output voltage signal at an output terminal thereof;

providing a feed-back capacitor coupled between the inverting input terminal and the output terminal to accumulate charges received from the input current source and to generate a feed-back voltage accordingly wherein the capacitor defines a negative feed-back loop of the voltage amplifier such that the output voltage is proportional to said accumulation of said charges;

providing a calibration unit including a calibration capacitor electrically coupled, via a calibration switch, to said inverting input terminal of said voltage amplifier and thereby electrically coupled to said feed-back capacitor, switching, by the calibration unit, the calibration switch to a calibration state permitting a discharge of a predetermined charge from the calibration capacitor to the feed-back capacitor, determining a voltage generated across said feed-back capacitor while said calibration switch is in said calibration state; and determining a capacitance value (C=Q/V) for the feed-back capacitor according to the value of the generated voltage (V) and the predetermined charge (Q).

The method may include providing a reset switch electrically coupled to the inverting input terminal of the voltage amplifier and electrically isolated from the output terminal of the voltage amplifier; using the feed-back capacitor to accumulate charges received from the input current source and generating said output voltage accordingly such that the output voltage is proportional to said accumulation of said charges; and, switching the reset switch to a state permitting a transfer of charge from the capacitor or to the capacitor.

In the method, a voltage amplifier may be provided having an inverting input terminal electrically coupled to an input current source, and a non-inverting input terminal, the voltage amplifier being arranged to provide an output voltage signal at an output terminal thereof. The method may enable a feed-back capacitor coupled between the inverting input terminal and the output terminal to form a negative feed-back loop of the voltage amplifier. Using the feed-back capacitor to accumulate charges received by, or received from, the input current source and generates the output voltage accordingly. The output voltage is proportional to the accumulation of said charges. The method may include providing a reset switch which is electrically coupled to the inverting input terminal of the voltage amplifier and electrically isolated from the output terminal of the voltage amplifier. The reset switch is switchable to a state permitting a transfer of charge from the capacitor, or to the capacitor. The non-inverting input terminal may be electrically coupled to a target voltage ($V_{target}$) of any desired value. This target voltage may be set to ground (i.e. held at zero volts), or may be set to a non-zero voltage value. The value of the target voltage determines the operating voltage at/to which the input current source may be driven (e.g., the operating voltage of a Faraday Cup).

The method may include providing the reset switch electrically coupled to the inverting input and switching the switch to a state permitting a discharge of at least some of the accumulated charge from the feed-back capacitor.

The reset switch may comprise a semiconductor device and the method may include switching the reset switch to generate at a terminal thereof, which is electrically coupled to the inverting input, an electrical charge having a polarity opposite to that of the accumulated charge, thereby permitting the discharge of accumulated charge to neutralise the electrical charge injected by the reset switch.

The method may include monitoring a voltage across the feed-back capacitor acquired from the accumulated charge, and controlling the reset switch to permit the discharge of accumulated charge when the acquired voltage rises above a first threshold voltage value which lies within the dynamic range of the voltage amplifier.

The method may include switching the reset switch between a first state permitting the discharge of accumulated charge and a second state which does not permit the discharge of accumulated charge, wherein the method includes monitoring a voltage across the feed-back capacitor while the reset switch is in the first state, and to controlling the reset switch to achieve the second state when the monitored voltage falls below a second threshold voltage value which lies within the dynamic range of the voltage amplifier.

The method may include determining a rate of change of voltage across the feed-back capacitor resulting from said accumulation of charge, and generating a current value representing a current received by the feed-back capacitor from the input current source.

In this way, a calibration capacitor may be electrically coupled, via a calibration switch, to the inverting input terminal of the voltage amplifier and thereby electrically coupled to the feed-back capacitor, the method including switching the calibration switch to a calibration state permitting a discharge of a predetermined charge from the calibration capacitor to the feed-back capacitor, and determining a voltage generated across the feed-back capacitor while the calibration switch is in the calibration state and determining a capacitance value ($C=Q/V$) for the feed-back capacitor according to the value of the generated voltage (V) and the predetermined charge (Q).

In a sixth aspect, the invention may provide a method of ion beam current measurement including providing a Faraday cup, electrically coupling the Faraday cup to the inverting input terminal of the voltage amplifier as the current source according to the method of capacitive trans-impedance amplification described above, receiving ions at the Faraday cup, and measuring the ion beam current according to the output voltage.

There now follows a description of preferred embodiments of the invention, with reference to the drawings briefly described below, which are provided to enable a better understanding of the broader inventive concept of the invention.

BRIEF DESCRIPTION OF DRAWINGS

FIG. 6B is a magnified view of a part of FIG. 6A. The plots in FIGS. 6A and 6B show the settling time of the amplifiers.

FIG. 7B is a magnified view of a part of FIG. 7A. The plots in FIGS. 6A and 6B show the settling time of the amplifiers. The plots in FIGS. 7A and 7B are similar to FIGS. 6A and 6B except that they show a shorter timescale.

DESCRIPTION OF EMBODIMENTS

Figure 1A:
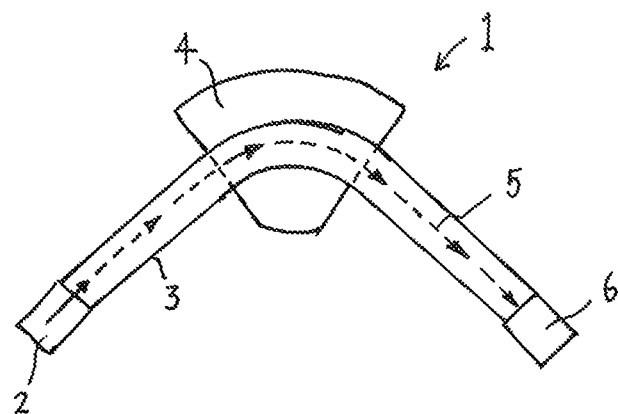
FIG. 1A schematically illustrates a mass spectrometer. The present invention may be employed in a mass spectrometer of this type, or other type.
Figure 1B:
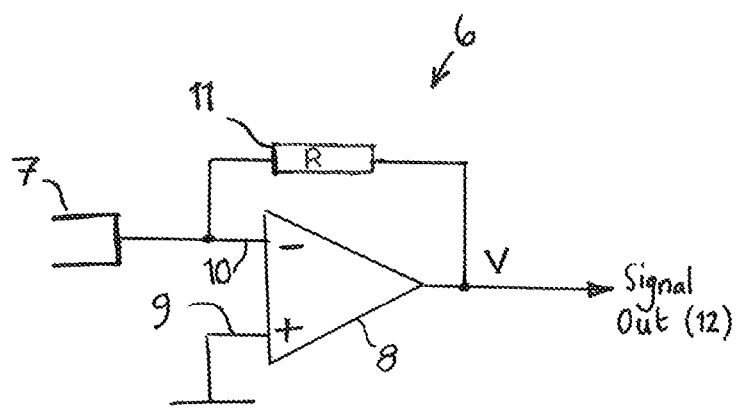
FIG. 1B schematically illustrates an amplifier for amplifying detection signals originating from a Faraday cup, such as may typically be used in a mass spectrometer of the type illustrated in FIG. 1A.

In the drawings like items are assigned like reference symbols, for consistency.

Figure 2:
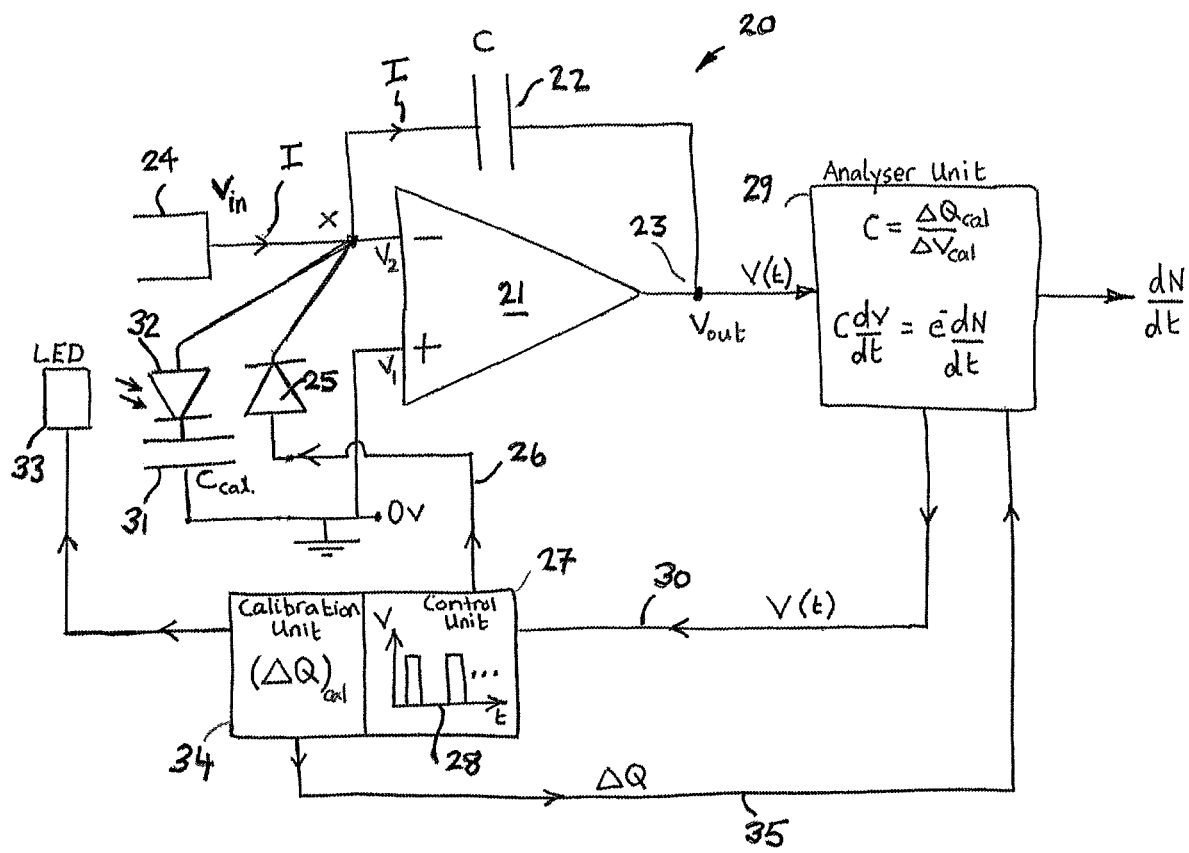
FIG. 2 schematically illustrates a capacitive trans-impedance amplifier according to an embodiment of the invention.

Referring to FIG. 2, here is shown a schematic diagram of a capacitive trans-impedance amplifier according to a preferred embodiment of the present invention. The capacitive trans-impedance amplifier comprises a voltage amplifier in the form of an operational amplifier (21) having an inverting input terminal (−) electrically connected to an input current source comprising a Faraday cup (24), and a non-inverting input terminal (+) electrically coupled to ground (0 volts). The operational amplifier has an output terminal (23) at which voltage output ($V_{out}$) is output. A feedback capacitor (20), having capacitance C farads, is coupled between the inverting input terminal (−) and the output terminal (23). The feedback capacitor has one capacitor terminal electrically connected to the voltage output terminal of the operational amplifier, and another capacitor terminal electrically connected to the inverting input terminal (−) of the operational amplifier. As a result, the feedback capacitor is arranged to accumulate charge corresponding to charged particles, such as positively-charged ions, received by the Faraday cup which in turn cause a corresponding charge to accumulate at the terminal of the feedback capacitor with which the Faraday cup is electrically connected. Accordingly, a voltage generated across the feedback capacitor in response to an accumulation of such charge, provides a feedback voltage between the inverting input terminal (−) and output terminal (23) of the voltage amplifier.

The voltage amplifier defines an inverting amplifier circuit. In this inverting amplifier circuit the operational amplifier (21) is connected with the feed-back capacitor (22) to produce a closed loop operation. The junction of the input terminal and feed-back signal (X) is at the same potential ($V_2$) as the positive (+) input ($V_1$), which is at zero volts or ground, and consequently the junction is a "Virtual Earth". Properties of inverting amplifiers or operational amplifiers, are that: substantially no current flows into the input terminals, and the differential input voltage is substantially zero (i.e. $V_1=V_2=0$ (Virtual Earth)). The equation for the output voltage $V_{out}$ is linear in nature for a fixed amplifier gain, and is:

$$V_{out}=V_{in}\times \text{Gain}.$$

This property is very useful for converting a smaller sensor signal to a much larger voltage. Accordingly, the output voltage ($V_{out}$) is proportional to the amount of charge accumulated by the feedback capacitor and, therefore, the amount of charge accumulated/received by the Faraday cup (24). The open loop gain of an operational amplifier is typically very high. For example the 'large signal voltage gain' of the amplifier employed in preferred embodiments may be specified as 120 dB (min)/143 dB (max).

The capacitive trans-impedance amplifier (20) includes a diode (25) having a cathode connected to the inverting input terminal (−) at, or a direct electrical communication with, the junction of the input terminal and the feedback signal (X). A control unit (27) is electrically connected to the anode of the diode (25) via a signal transmission line (26) via which diode switching signals are transmitted from the control unit to the diode. In response to such diode switching signals, the diode is switchable from a non-conducting state to a conducting state permitting a discharge of at least some of the/any accumulated charge from the feed-back capacitor. The diode may be a p-n diode, and therefore is a device with non-linear conductivity (e.g. exponentially increasing) in response to a linear increase in a voltage applied thereto in forward bias. The diode is arranged to generate an output (i.e. charge carriers) at the cathode thereof in response to a switching voltage applied to the anode thereof, to change the state (i.e. to switch) the diode to a state permitting discharge of accumulated charge in the feed-back capacitor. For example, the diode may be switchable to a state in which it generates negatively-charged charge carriers (i.e. electrons) at the cathode of the diode, which is in electrical connection with the feed-back capacitor, thereby to permit positive charge (i.e. a depletion of electrons) accumulated by the feed-back capacitor to discharge to neutralise the negatively-charged charge carriers at the cathode of the diode switch.

The switching of the switch (25) is implemented by applying, from the control unit (28), a switching voltage signal (26) in the form of a voltage pulse (28) to the anode of the semiconductor switch, of sufficient magnitude to change the state of the switch from a non-conducting state to a conducting state. For example, the voltage pulse (28) may be a square-wave pulse which rises from substantially 0V, or at least from a voltage of magnitude sufficiently small as appropriate to a non-conducting state of the switch, to a pulse peak value amply sufficient to render the switch conductive. The duration of the pulse may be a period of time which may be selected as desired, and appropriate to achieve sufficient discharge of the feed-back capacitor. Preferable examples are a period of time equal to or less than about 400 μs. in this way, only during the duration of the switching pulse (20) is the switch (25) rendered conductive and the feed-back capacitor may discharge, whereas after the switching pulse has ended, the switch is rendered non-conducting and the feed-back capacitor may no longer discharge through the switch, and may resume charge accumulation fully. It is to be noted that the feedback capacitor is not prevented from continuing to accumulate charge during a discharging period, however the rate of discharge will, in typical applications, greatly exceed the rate of charge accumulation with the net effect that the feedback capacitor at least partially discharges during that period. The precision of the end point after discharging the capacitor is not critical, the relevant measurement is the difference between the start voltage (at the start of integration) and end voltage, and this difference is unaffected by variations in the start voltage.

The controller unit thereby also controls the switch to prevent discharge of the feedback capacitor, thereby permitting accumulation of charge by the feed-back capacitor, for a period of time which may be selected as desired, such as a period of time equal to about 100 μs, or up to a few seconds. The integration time can vary over a very wide range. The controller unit is arranged to control the switch to permit discharge of the feedback capacitor periodically or intermittently. Relatively shorter periods of time, during which discharge is permitted, are separated by relatively longer periods of time in which discharge is prevented and charge is accumulated (or re-accumulated) by the feedback capacitor. Accordingly, the switching voltage signal (28) generated by the control unit (27), and applied (26) to the anode of the switching diode (25) may comprise a succession of relatively narrow voltage pulses separated by relatively much greater periods in which no pulse exists.

The switch is thereby switchable between a first state permitting the discharge of accumulated charge and a second state which does not permit the discharge of accumulated charge. The controller unit is arranged to monitor a voltage across the feed-back capacitor while the switch is in the first state, and to control the switch to achieve the second state when the monitored voltage falls below a second threshold voltage value which lies within the dynamic range of the voltage amplifier. The control unit is arranged to monitor the voltage ($V(t)=V_{out}$) generated across the feed-back capacitor from the accumulated charge, and to control the switch the first state, by applying a switching voltage pulse (28) to the switch (25), when the acquired voltage rises above a first threshold voltage value which lies within the dynamic range of the voltage amplifier. The controller unit is, in this way, arranged to controllably apply a switching/drive voltage pulse to the anode of the diode switch as and when desired, having the appropriate polarity and magnitude to render the switch conductive. The control unit (27) comprises a monitoring signal input (30) for receiving a signal ($V(t)=V_{out}$) representative of the voltage across the feedback capacitor. This signal is compared to the first threshold voltage value and the second threshold voltage value, both of which are stored within the control unit, for this purpose. Representative values of the first and second threshold voltages are any value within the range of +5V to −5V, but it is to be understood that these values can vary over a wide range.

Another, alternative method to control the voltage across a feedback capacitor is as follows. The following method involves the injection of a required electric charge into the feedback capacitor by issuing a voltage pulse (28) to the switch (25) with a pulse duration of T seconds and pulse voltage/amplitude of $V_s$ volts, which are predetermined beforehand using the following formula:

$$V_s = V(I_s)$$

where $V(I_s)$ is the voltage across the switch (25) for any given current, $I_s$, through the switch. The required current $I_s$ is calculated using the formula:

$$I_s = C\frac{\Delta V}{T}$$

where C is the capacitance of the feedback capacitor, and $\Delta V$ is the required change in the voltage across the capacitor. The method includes the following steps:

(1) At any required moment in time, for example, when the voltage across the feedback capacitor is above the upper the upper limit or below the lower limit of the desired operational range of the amplifier or, for example, at the beginning of a measurement cycle, the required voltage change $\Delta V$ is calculated. For example, if the feedback capacitor voltage, at a current time, is $V_c$ and the required voltage (across the feedback capacitor) is $V_r$, then the voltage change $\Delta V=V_c-V_r$. Using a desired value of pulse duration (T), the required switch voltage $V_s$ is calculated using the above formula. In the case of a simple resetting of the capacitor voltage the value of the required voltage is $V_r=0$, and, therefore $\Delta V=V_c$.

(2) The voltage pulse (28) is then applied to the switch (25), with a duration T and calculated voltage $V_s$. By the end of the pulse the voltage across the capacitor will be at the desired level.

The polarity of the pulse should be considered. If the voltage output of the amplifier is required to be made lower than the current value of that voltage, then the pulse (28) applied to the switch (25) is controlled to have a positive polarity. If the amplifier's output voltage is required to be higher than the current voltage, then the pulse (28) applied to the switch (25) is controlled to have a negative polarity. Advantages of this alternative method include the following. The process of resetting the feedback capacitor can be done much more quickly and without a control of the amplifier output voltage during the process. The process of resetting the feedback capacitor takes the same, well-defined time regardless of the required voltage change. The voltage across the capacitor could be set to any desired level. Nevertheless, the other method described herein, has an advantage in requiring less precision of the final voltage compared to the alternative method described in steps (1) and (2) above, due to limitations in the obtainable precision of the voltage $V(I_s)$.

In this way, the controller unit is able to control the amount of charge accumulated on the feed-back capacitor such that the corresponding voltage upon the feed-back capacitor does not exceed the maximum desired voltage appropriate to the voltage amplifier, and may also control the amount charge retained by the feed-back capacitor at the end of a discharge event, such that the corresponding voltage upon the feed-back capacitor does not fall below the minimum desired voltage appropriate to the voltage amplifier. In this way, the voltage across the feed-back capacitor may be controlled to lie within an optimal range, or at least an appropriate range, of values which enable the voltage amplifier to work optimally, or at least most appropriately. This allows active control to avoid saturation of the voltage amplifier, or other performance degradation which may occur due to inappropriate voltage upon the feed-back capacitor.

As a consequence of this, the capacitive trans-impedance amplifier of the present invention, in preferred embodiments, is able to be adapted to amplify a very broad range of input signal intensities/strengths corresponding to a very wide range of e.g. different ion signal strengths received at the Faraday cup (24) in a mass spectrometer.

Figure 3:
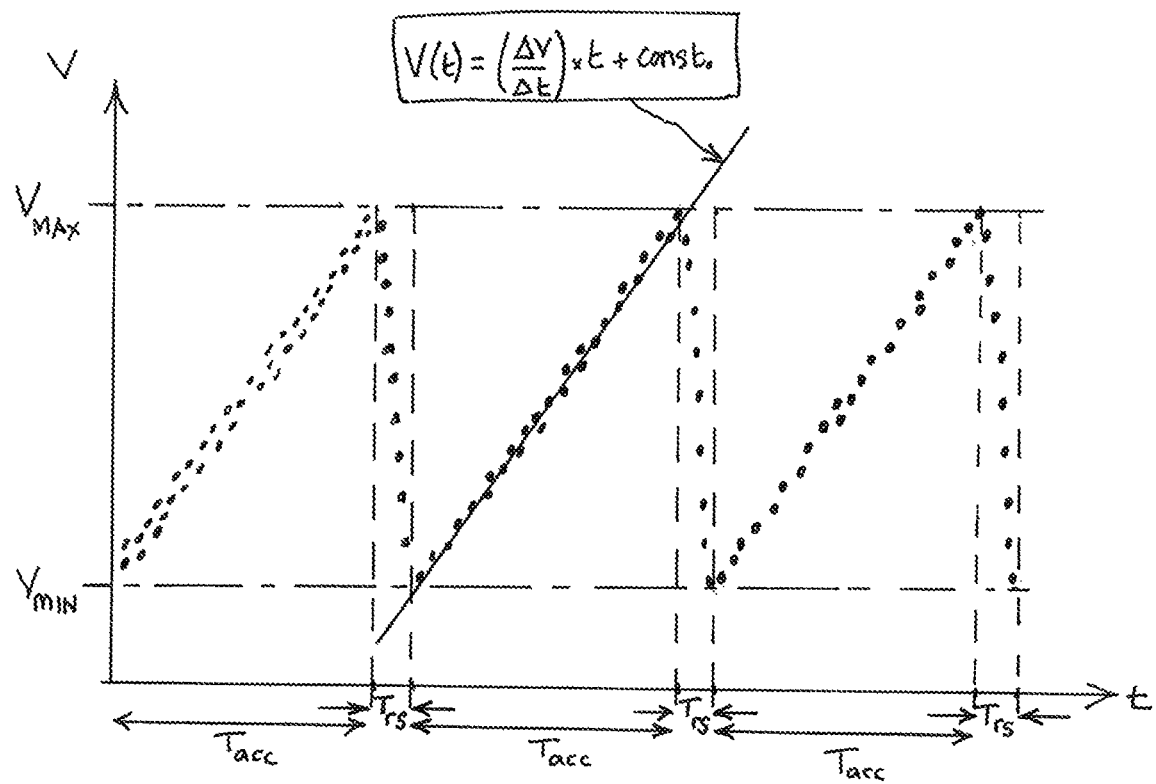
FIG. 3 a schematically illustrates a typical time variation of a voltage signal output from a capacitive trans-impedance amplifier according to a preferred embodiment of the invention, in response to input particle detection signals (e.g. detection of negative ions at a Faraday cup in a mass spectrometer, such as the type shown in FIG. 1A)

FIG. 3 schematically illustrates a graph representing the time-change in output voltage signals ($V(t)=V_{out}$) generated by the capacitive trans-impedance amplifier in response to a continuous and substantially constant flow rate of negative ions received at the Faraday cup (24) of the system illustrated in FIG. 2. During a charge accumulation time ($T_{acc}$), in which the feedback capacitor is permitted to accumulate charge resulting from the arrival of ions at the Faraday cup, the output voltage signal from the capacitive trans-impedance amplifier continuously rises as time progresses until such time as the output voltage signal of the voltage amplifier (21) reaches the value ($V_{MAX}$) of the upper voltage threshold representative of the upper limit of the dynamic range of the amplifier. At this point, the control unit controls the switch (25) to acquire a conductive state permitting the feedback capacitor to discharge over a subsequent "reset" period of time ($T_{rs}$) which begins when the amplifier output voltage signal matches the upper voltage threshold value, and ends when that amplifier output voltage signal has fallen to a value which matches the lower voltage threshold ($V_{MIN}$) representative of the lower limit of the dynamic range of the amplifier. Once that lower voltage threshold has been reached, the control unit is arranged to terminate the voltage switching pulse (28) apply to the switch (25) so as to render that switch non-conductive thereby permitting the feedback capacitor to resume charge accumulation. This process is repeated periodically and successively as charge continues to be accumulated at the feedback capacitor. Thus, the output voltage signal of the trans-impedance amplifier resembles a saw-tooth waveform as illustrated schematically in FIG. 3.

In alternative embodiments, the control unit may simply control the switch (25) to acquire a conductive state permitting the feedback capacitor to discharge of a fixed "reset" period of time ($T_{rs}$) which begins at a preset time, and is not dependent upon the amplifier output voltage signal matching the upper voltage threshold value. The fixed "reset" period of time ($T_{rs}$) may then end when simply at the end of the fixed reset period, and is then not dependent upon amplifier output voltage signal having fallen to a value which matches the lower voltage threshold ($V_{MIN}$) representative of the lower limit of the dynamic range of the amplifier. A suitable choice of fixed "reset" period of time ($T_{rs}$) may ensure that the amplifier output voltage signal remains within the dynamic range of the amplifier.

A consequence of this is that the dynamic range of the voltage amplifier (21) of the capacitive trans-impedance amplifier does not place a constraint on the ability of the voltage amplifier (21) to continue receiving input signals of increasing magnitude from the Faraday cup. Rather, the voltage amplifier is able, in principle, to continue to receive input signals indefinitely. Contrast this with prior art amplifiers employing feedback resistors where the output signal is a static voltage which is constrained by the voltage range of the amplifier.

In the present invention, according to preferred embodiments, when a very weak ion signal is incident upon the Faraday cup, this will result in a very low current signal, or charge accumulation rate, at the feedback capacitor of the capacitive trans-impedance amplifier. Accordingly, relatively long integration times ($T_{acc}$) are appropriate to such a measurement in order that an accurate ion counter signal may be derived. The rate of increase of the voltage at the feed-back capacitor is, accordingly, relatively low in such a circumstance which means that a long integration time is possible without the feed-back capacitor voltage exceeding the dynamic range of the voltage amplifier. Consider if a strong ion signal is incident upon the Faraday cup. This will result in a relatively much higher current signal, or charge accumulation rate, at the feedback capacitor of the capacitive trans-impedance amplifier. Accordingly, relatively short integration times ($T_{acc}$) would be appropriate to such a measurement since the voltage across the feedback capacitor would rapidly reach the upper limit of the dynamic range of the voltage amplifier. A particular advantage of the present invention is that an arbitrarily long integration time can be used for a high current signal/ion signal because the voltage at the feed-back capacitor is able to be rapidly discharged before/as it approaches the upper limit of the dynamic range of the voltage amplifier, and the voltage across it is rapidly reduced to a suitable low value within that dynamic range. Charge accumulation can resume and integration of the ion signal can continue thereafter. Accordingly, a high ion-count signal can be accommodated by accumulating charge across the feed-back capacitor in a piecemeal fashion without requiring termination of the measurement. This enables very high and very low ion-count signal strengths to be handled by the self-same capacitive trans-impedance amplifier.

The capacitive trans-impedance amplifier includes an analyser unit (29) connected to the output terminal (23) of the voltage amplifier (21), and is arranged to receive the output voltage signal of the voltage amplifier. The analyser unit is arranged to determine a rate of change of voltage across the feed-back capacitor resulting from its accumulation of charge. From this rate of change value, the analyser unit is arranged to generate a current value representing a current received by the capacitive trans-impedance amplifier from the Faraday cup.

The Faraday cup derives its current by the collection of charged particles, and by measuring the electrical current (I) generated by the Faraday cup, the number (N) of charge carriers (charge e) flowing in this current per unit of time (t), one may determine/count the number of ions/particles received by the Faraday cup per unit of time. In particular, a change $\Delta Q$ in the charge accumulated by the feed-back capacitor having a capacitance C, is equivalent to $C \times \Delta V$, where $\Delta V$ is the corresponding change in voltage across the feed-back capacitor. Thus, the electrical current supplied to the feed-back capacitor is the rate of change of accumulated charge (i.e. the rate of arrival of ions/particles received by the current source) and is derivable from the rate of change of the voltage (V) across the feed-back capacitor as follows:

$$\frac{\Delta Q}{\Delta t} = C \frac{\Delta V}{\Delta t} = I \qquad \text{eq. (7)}$$

The analyser unit is arranged to calculate the rate of change of voltage across the feed-back capacitor, and to derive therefrom a value representative of the electrical current (I) supplied to the feed-back capacitor. The analyser unit is arranged to apply a process of a linear regression to the values of output voltage(V(t)) received by it from the voltage amplifier (21) so as to determine a linear rate of change of that voltage. This is schematically illustrated as a linear regression line in FIG. 3 component to the following linear equation:

$$V(t) = \text{Grad.} \times t + \text{const.} = \left(\frac{\Delta V}{\Delta t}\right) \times t + \text{const.} \qquad \text{eq. (8)}$$

The analyser unit is arranged to determine the linear rate of change of voltage as the gradient ("Grad.") of this linear regression equation. Using this gradient measurement, the analyser unit is arranged to determine a value representative of the rate of arrival of ions/particles received by the Faraday cup ($\Delta N/\Delta t$), where N is the number of ions received, by multiplying together the measured gradient value and the value (C) of the capacitance of the feed-back capacitor, and dividing by the charge per particle, as follows:

$$\frac{\Delta N}{\Delta t} = \frac{C \times \text{Grad.}}{e} \qquad \text{eq. (7)}$$

wherein the analyser unit may be arranged to calculate the number (N) of ions received over a given period of time, by multiplying this quantity by the value of the time interval in question. The value of the capacitance (C) of the feed-back capacitor may be pre-determined by prior measurement, or may be determined directly by a feed-back capacitor calibration process described below.

The capacitive trans-impedance amplifier includes a calibration unit (34) including a calibration capacitor (31) of capacitance $C_{cal}$, which is electrically coupled, via a calibration switch (32), to the junction of the inverting input terminal of the voltage amplifier and the feed-back capacitor, and is thereby electrically coupled to the feed-back capacitor. The calibration unit is operable to switch the calibration switch (32) to a calibration state permitting a discharge of a predetermined charge ($Q_{cal}$) from the calibration capacitor into the feed-back capacitor. The analyser unit is also arranged to determine, as a consequence of this controlled charge injection, a voltage ($\Delta V_{cal}$) generated across the feed-back capacitor and to determine a capacitance value ($C=\Delta Q_{cal}/\Delta V_{cal}$) for the feed-back capacitor according to the value of the generated voltage ($\Delta V_{cal}$) and the predetermined charge ($\Delta Q_{cal}$). In this way, a controlled and pre-defined quantity of charge ($\Delta Q_{cal}$) may be injected from the calibration capacitor into the feed-back capacitor, and measuring the change in voltage ($\Delta V_{cal}$) across the feed-back capacitor resulting from this charge injection, the analyser unit may calculate the capacitance of the feed-back capacitor. It is not necessary that the feedback capacitor has been fully discharged by the switch (25) prior to this calibration sequence. It is also not necessary to fully disconnect the Faraday cup from the feedback capacitor at that time.

The calibration switch (32) comprises a p-n photodiode that converts incident light into current when photons are absorbed in the photodiode. An LED light source (30) is arranged adjacent the photodiode switch (32) and is operatively connected to the calibration unit (34) to receive illumination signals to which the LED is responsive to illuminate the photodiode with light of intensity sufficient to cause it to generate the aforementioned charge carriers. Thus, the photodiode is arranged to generate an output of charge carriers in response to an illumination applied to the photodiode to change the state (i.e. to switch) the photodiode to a state permitting discharge of charge in the calibration capacitor. The cathode of the photodiode is connected to a terminal of the calibration capacitor, and the anode of the photodiode is connected via the junction point (X), to one terminal of the feed-back capacitor (22). Consequently, the anode of the calibration switch is electrically connected to a "virtual ground" provided at the inverting input of the voltage amplifier to which a terminal of the feed-back capacitor is concurrently connected. In other preferred embodiments, pairs of amplifiers may be connected to a common calibration capacitor (i.e. one calibration capacitor for each pair, with potentially multiple pairs). The method would then be to make a ratiometric calibration as between capacitors of each separate pair. In other embodiments, calibration is done with respect to an absolute reference capacitance. The terminal of the calibration capacitor not connected to the calibration switch is electrically coupled to earth/ground. With this arrangement, by applying an illumination signal to the LED (33) the calibration unit is able to inject a controlled quantity of charge into the feed-back capacitor. The calibration unit is communicatively connected to the analyser unit by a signal transmission line (35) by which the calibration unit is arranged to communicate the value of this predetermined quantity of charge ($\Delta Q_{cal}$) to the analyser unit. The analyser unit is arranged to determine a value for the capacitance (C) of the feedback capacitor by monitoring a corresponding change $\Delta V_{cal}$ in the output voltage signal received by it from the voltage amplifier (21) as a consequence of this calibration charge injection procedure, according to the following equation:

$$C=\Delta Q_{cal}/\Delta V_{cal} \qquad \text{eq. (8)}$$

With this calculated value of capacitance for the feedback capacitor, the analyser unit is arranged to determine a value representative of the rate of arrival of ions/particles received by the Faraday cup ($\Delta N/\Delta t$), according to equation (7) above, and to output of the result.

It will, of course, be understood that the invention in preferred embodiments, may provide a mass spectrometer comprising an ion counter as described above. The mass spectrometer may be a Nier type mass spectrometer such as is schematically illustrated in FIG. 1A, or may be any other type of mass spectrometer. The invention may provide an electrometer or a photometer comprising a capacitive trans-impedance amplifier as described above.

Furthermore, the embodiments described above implement a method according to the invention, for capacitive trans-impedance amplification and for mass spectrometry and/or ion counting (e.g. ion beam current measurement). Accordingly, in preferred embodiments the invention also provides a method of capacitive trans-impedance amplification comprising providing a voltage amplifier having an inverting input terminal electrically coupled to an input current source, and a non-inverting input terminal electrically coupled to ground, the voltage amplifier being arranged to provide an output voltage signal at an output terminal thereof. The method includes providing a feed-back capacitor coupled between the inverting input terminal and the output terminal wherein the capacitor defines a negative feed-back loop of the voltage amplifier, and using the feed-back capacitor to accumulate charges received by, or received from, the input current source and generating the output voltage accordingly such that the output voltage is proportional to the accumulation of said charges.

Figure 4:
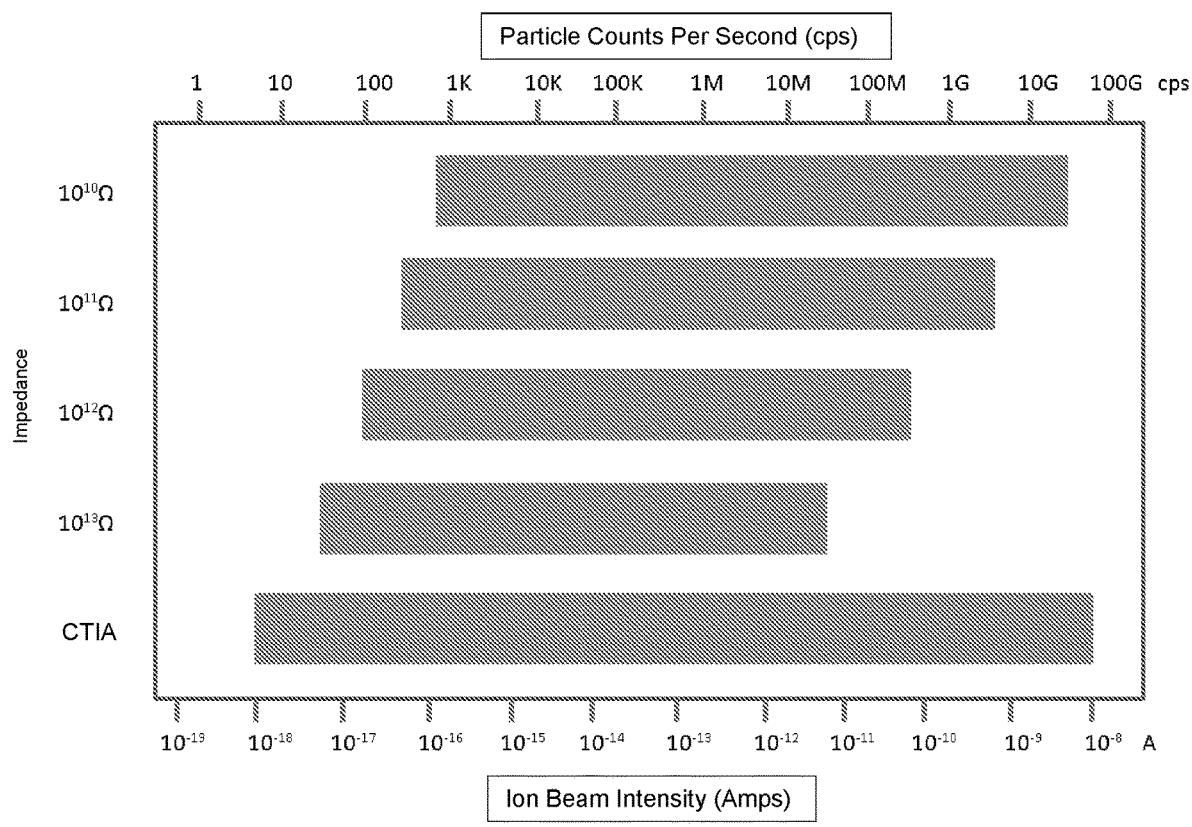
FIG. 4 schematically illustrates the dynamic detection range of a capacitive trans-impedance amplifier according to preferred embodiments of the invention, in comparison with the dynamic ranges of separate resistor-based amplifiers of the prior art.

Furthermore, FIG. 4 schematically illustrates the dynamic detection range (detectable ion beam intensity (amps), or particle count/sec (cps)) of a capacitive trans-impedance amplifier (CTIA) according to preferred embodiments of the invention, in comparison with the dynamic ranges of separate resistor-based amplifiers of the prior art, of selected impedances. Whereas, in the present invention, using a capacitor in the negative feedback loop of the voltage amplifier enables a very broad dynamic range to be achieved by the amplifier, in prior art systems based on feedback resistor principles, it is necessary to employ a different resistor for a specific, relatively narrow dynamic range in an amplifier. For example, a feedback resistor of about $10^{10}$ ohms is necessary in an amplifier designed to operate to amplify signal counts from ion beams corresponding to nano amps. However such a resistor is not suitable for amplifying ion beams corresponding to people amps of femto amps. Typically a feedback resistor of about $10^{11}$ ohms is necessary in an amplifier designed to operate to amplify signal counts from ion beams corresponding to of the order of 100 people amps, whereas a feedback resistor of $10^{12}$ ohms is for ion beams corresponding to Pico amps. Typically, a feedback resistor of $10^{13}$ ohms is necessary when dealing with ion beams of the order of 100 femto amps. Currently, feedback resistors of sufficient resistance are not available for handling ion beams significantly less than tens of femto amps. However, the capacitive trans-impedance amplifier according to the present invention, in preferred embodiments, is operable in the low beam intensity regime and across all of the regimes discussed above and schematically illustrated in FIG. 4.

Figure 5:
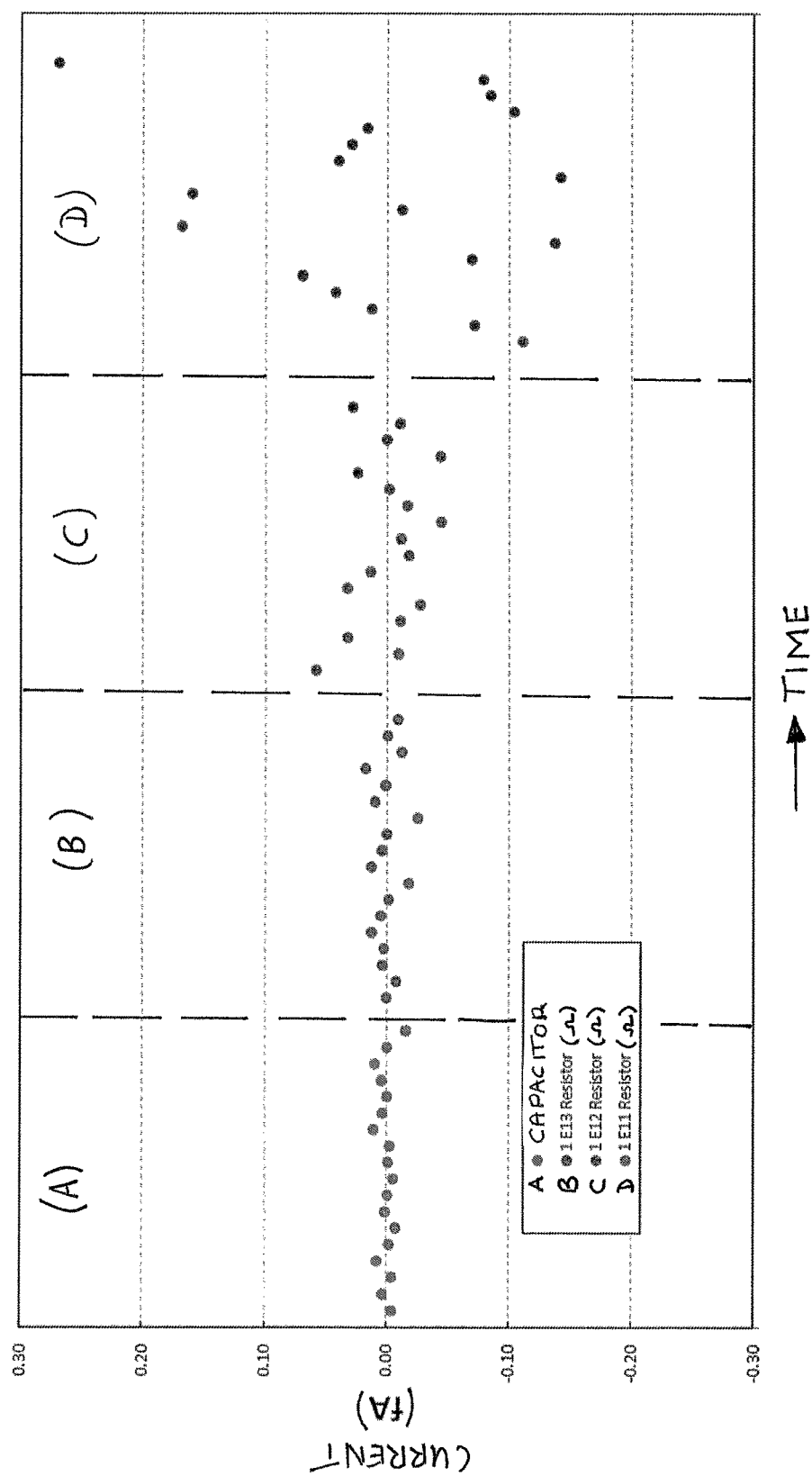
FIG. 5 graphically shows a comparison of noise baseline signals of a capacitive trans-impedance amplifier according to preferred embodiments of the present invention, in comparison to noise baseline signals generated by feedback resistor-based amplifiers of the prior art. Each data point on this plot represents a 10 second integration time.

A further advantage of the present invention, in preferred embodiments is that thermal noise which is so problematical in resistor-based amplifiers, is very significantly reduced by virtue of using a feedback capacitor. FIG. 5 graphically shows a comparison of noise baseline signals of a capacitive trans-impedance amplifier according to preferred embodiments of the present invention, in comparison to noise baseline signals generated by feedback resistor-based amplifiers of the prior art. This figure plots, on the vertical axis the noise level in femto amps measured over a period of time encompassing 18 successive measurements from amplifier disconnected from a Faraday cup, or connected to a Faraday cup to which no ion signal is directed ideally, of course, one would hope to achieve substantially no ion count signal from the amplifier under such circumstances. However, noise inherent in the system will always provide some degree of output signal. In section (A) of the graph, the capacitive trans-impedance amplifier according to the present invention was employed and this shows very little noise, and a baseline centred on zero femto amps. Compare this to section (B) of FIG. 5 corresponding to an amplifier based on a resistor feed-back loop containing a resistor of $10^{13}$ ohms. One can see that a greater degree of scatter is present in the data. This trend is shown to increase significantly as evidenced by section (C) and section (D) of FIG. 5 which show results in which the resistor-based feedback loop contains a resistor of $10^{12}$ ohms and $10^{11}$ ohms, respectively. It is clear that the noise level achieved by the capacitor-based feedback architecture of the present invention enables a vastly improved baseline noise level in the capacitive trans-impedance amplifier which enables accurate measurement of much smaller/weaker currents than could be achieved in existing resistor-based systems.

The isolation of the reset switch (25) from the output port (23) of the voltage amplifier (21) has the effect that any voltage dropped across the reset switch when it is in the 'open' state is not coupled to the amplifier output port. There is no leakage of current to the amplifier output port when the reset switch in 'open' (due to any switch imperfection). Furthermore, since the feedback capacitor (22) is reset by injection of charges through a diode, the voltage of the feedback capacitor may be reset very quickly and to any desired reset voltage value. This is because resetting does not simply involve 'draining out' changes accumulated in the feedback capacitor until the capacitor eventually falls to 0V, which may be a relatively slow process, but instead may involve an active resetting of that voltage, to any target voltage, by charge injection. The target voltage may be 0V but may also be any other appropriate voltage (positive or negative in polarity e.g. less than 0V, or opposite to the polarity of the voltage immediately before resetting takes place).

Figure 6A:
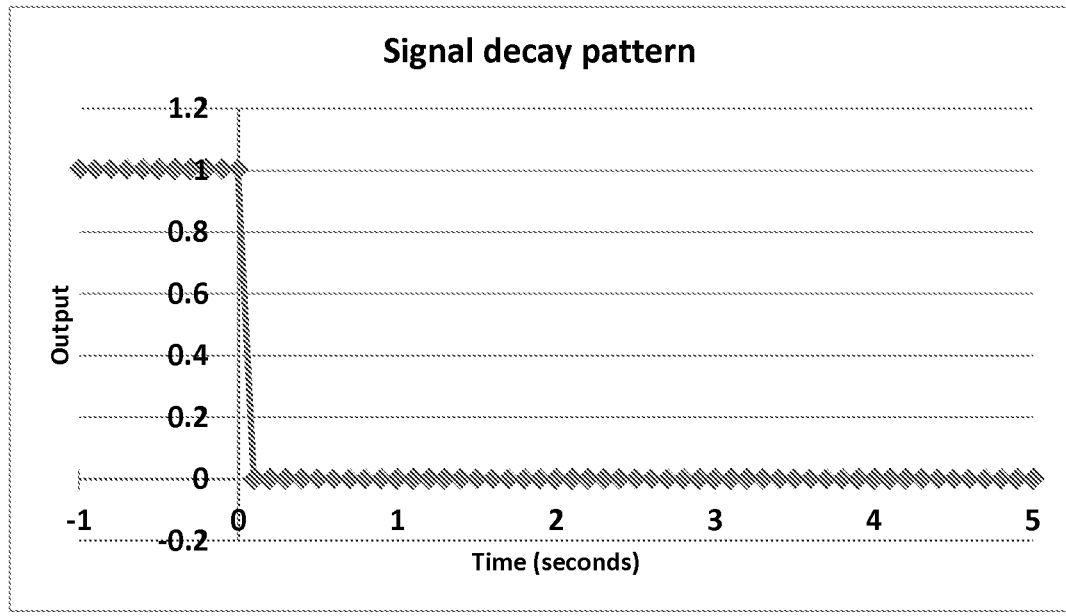
FIG. 6A and FIG. 6B graphically show a signal decay pattern in an amplifier of an embodiment of the invention. The signal integration time for each data point is 100 ms.
Figure 6B:
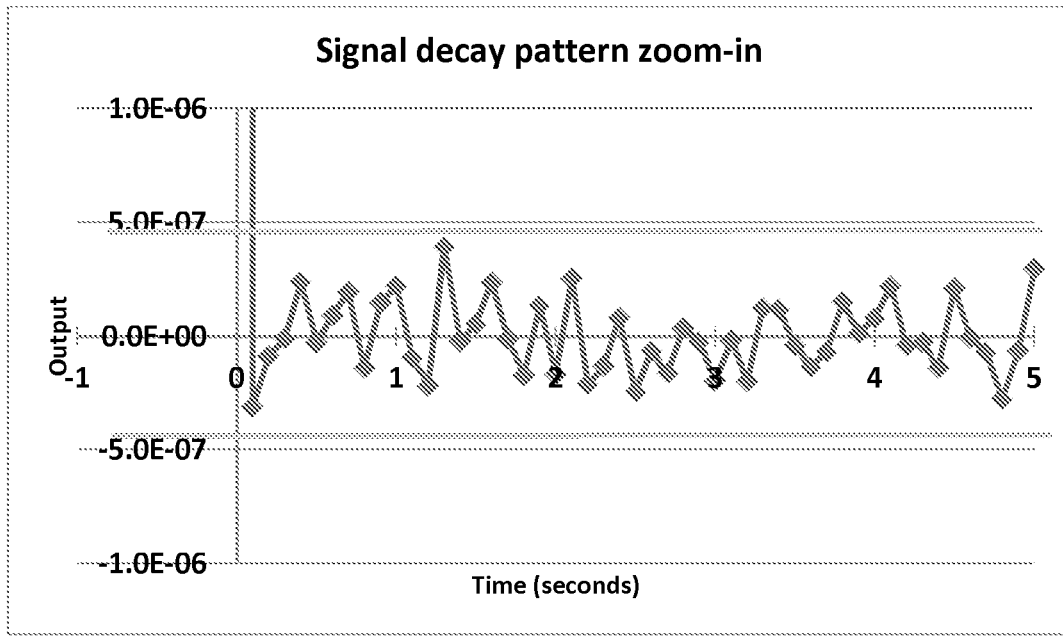
Figure 7A:
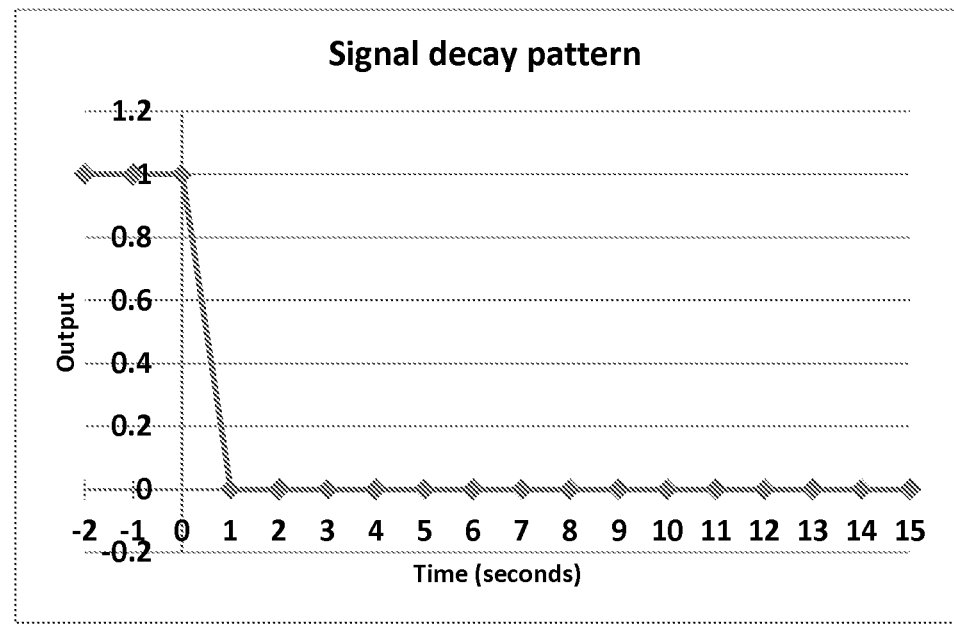
FIG. 7A and FIG. 7B graphically show an ion current signal decay pattern in an amplifier of an embodiment of the invention. The signal integration time for each data point is 1000 ms.
Figure 7B:
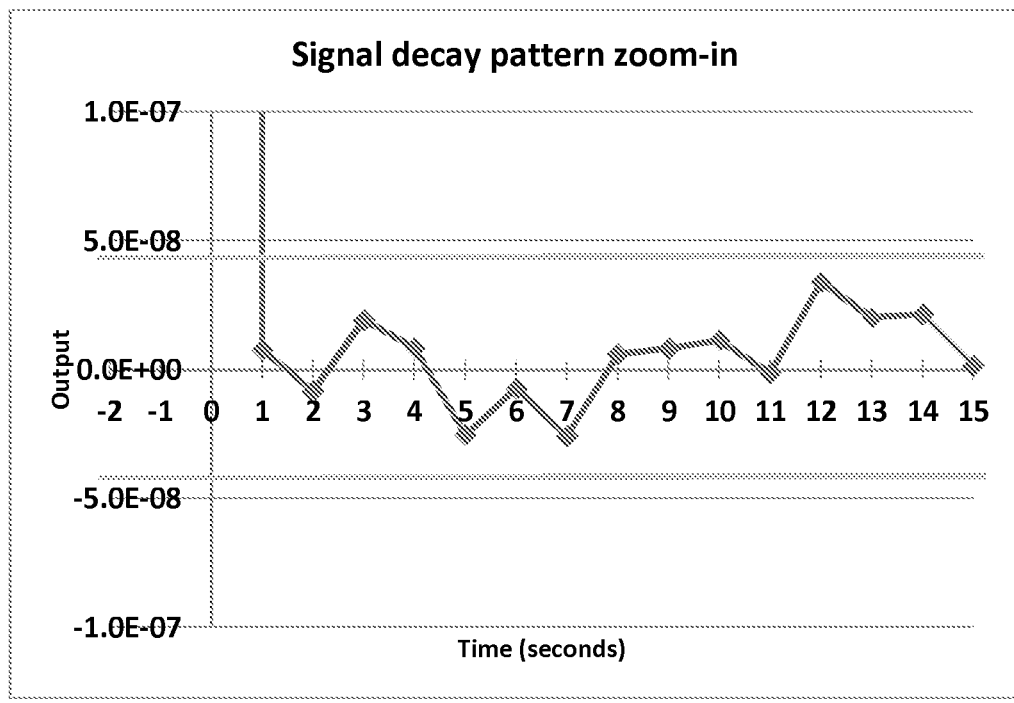

The effect of this is shown in FIG. 6A and FIG. 6B which graphically show a signal decay pattern in an amplifier of an embodiment of the invention. Those plots show the response speed (settling time) of the amplifier output when used in a mass spectrometer, after a step change in ion beam current has occurred. The signal integration time for each data point is 100 ms, 10 runs averaging. FIG. 6B is a magnified view of a part of FIG. 6A. The output signal settled to less than 0.5 ppm (500 ppb) of the original signal on the first reading after the signal decay. The settling time of the amplifier after a step change in ion beam current is a key parameter, this is because data collection cannot resume until the amplifier output has settled to a steady following the step change. Thus, an extended settling time wastes valuable time and, when sample material is being ionised continuously, this leads to wasting sample material which may be limited in quantity. FIG. 7A and FIG. 7B show the output settles to within a band of +/−5e-8 within 1 second of a step in the input current. This is further example of the immunity of the invention to parasitic capacitance, in conventional amplifiers it typically takes tens of seconds, or even minutes, to decay to the lowest measurement levels needed to measure lower sample/beam intensities. FIG. 7B is a magnified view of a part of FIG. 7A. The signal integration time for each data point is 1000 ms, 10 runs averaging. The bounding horizontal lines in FIG. 6B and FIG. 7B show +/−3 standard deviations of the amplifier noise.

Figure 8:
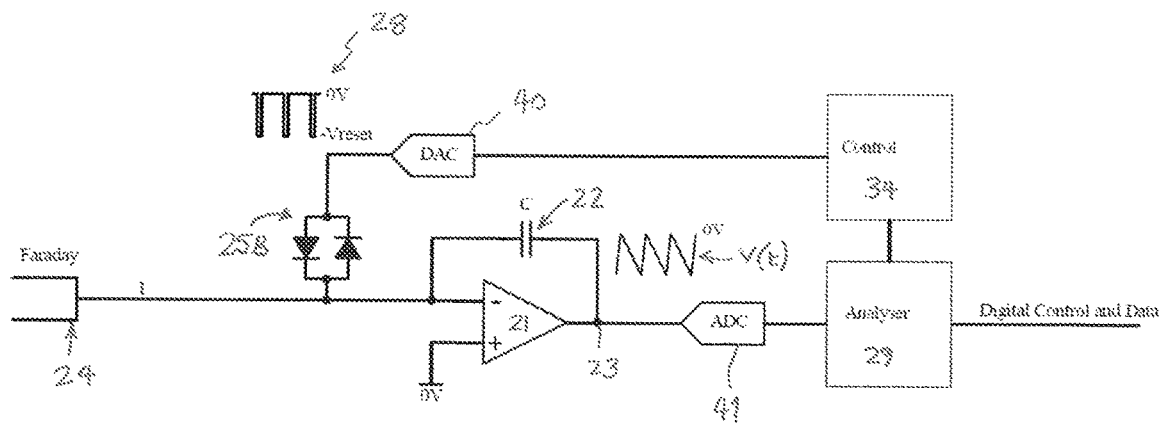
FIG. 8 schematically illustrates capacitive trans-impedance amplifier according to an embodiment of the invention, in which feedback calibration capability is not included, but in which the capability to measure/detect either positive or negative particles is provided.

FIG. 8 schematically illustrates capacitive trans-impedance amplifier according to an embodiment of the invention, in which feedback calibration capability is not included, but in which the capability to measure/detect either positive or negative particles is provided. The analogue output signal at the output port (23) of the voltage amplifier, is input to the analyser unit via an analogue-to-digital converter (ADC, 41) as a digital signal. The analyser unit (29) and the control unit (34) comprise a digital processor arranged to implement the functionality described above with reference to FIG. 2. The control unit is arranged to output a switching voltage signal in digital form to a digital-to-analogue converter (DAC, 40) which, in turn, provides an analogue switching voltage signal (26) in the form of a voltage pulse (28) to the anode/cathode of a semiconductor switch (28B) comprising two diodes connected in parallel with the anode of each connected to the cathode of the other. The switching pulse is of sufficient magnitude to change the state of one of the two diodes of the switch from a non-conducting state to a conducting state. The polarity of the switching pulse determines which of the two diodes of the switch (28B) is rendered conductive, the other diode remaining non-conductive (in reverse bias) in responds to the switching pulse. For example, the voltage pulse (28) may be a square-wave pulse which falls from substantially 0V, as appropriate to a non-conducting state of the switch, to a negative pulse peak value ($-V_{reset}$) sufficient to render only one of the two diodes of the switch conductive, to allow charge flow in a first direction. The duration of the pulse may be a period of time which may be selected as desired, and appropriate to achieve sufficient discharge of, or charge injection to, the feed-back capacitor (22). A positive pulse peak value ($+V_{reset}$) would render only the other of the two diodes of the switch conductive, to allow charge flow in a second direction opposite to the first direction.

Figure 9:
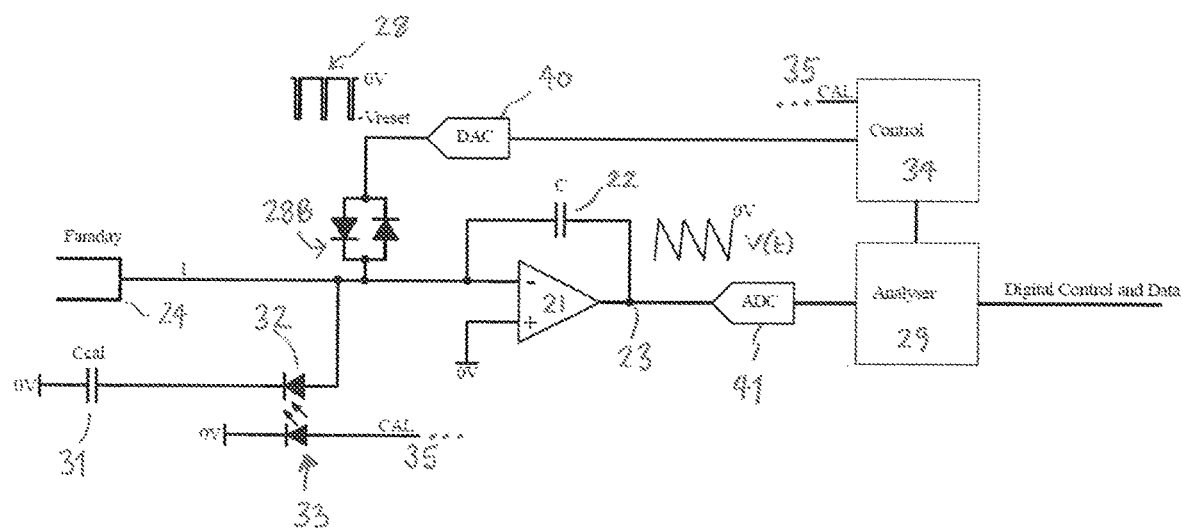
FIG. 9 schematically illustrates capacitive trans-impedance amplifier according to an embodiment of the invention, in which feedback calibration capability is included, and in which the capability to measure/detect either positive or negative particles is provided.

FIG. 9 schematically illustrates capacitive trans-impedance amplifier of FIG. 8 according to an embodiment of the invention, in which feedback calibration capability is included, as described with reference to FIG. 2 above.

Figure 10:
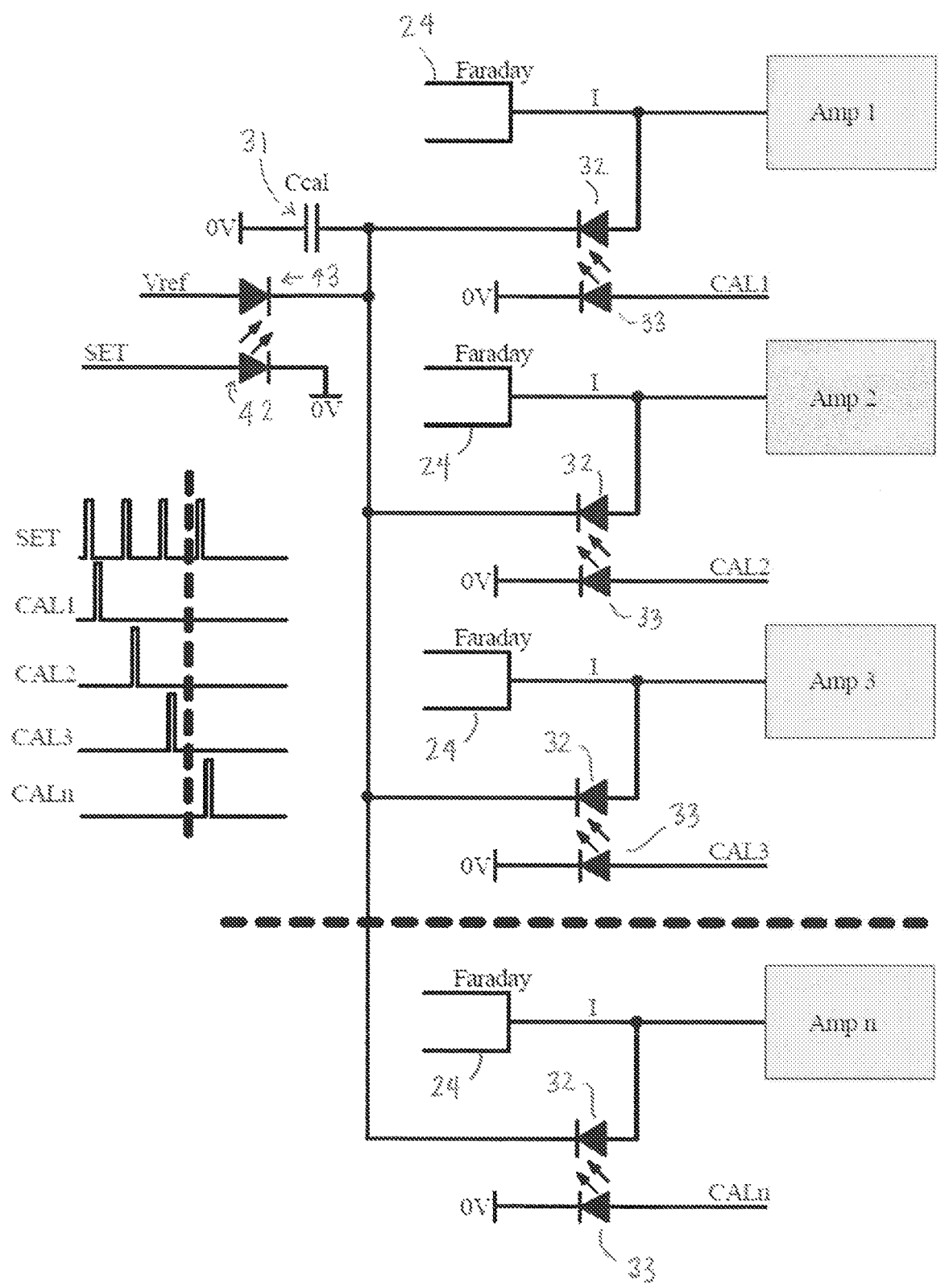
FIG. 10 schematically illustrates a calibration circuit comprising a plurality of capacitive trans-impedance amplifiers according to an embodiment of the invention, in which collective feedback calibration capability is provided.

FIG. 10 schematically illustrates a calibration circuit comprising a plurality of ('n' in total; n=positive integer) capacitive trans-impedance amplifiers each according to the arrangement described with reference to FIG. 9. Each amplifier comprises main amplifier part ('Amp 1', 'Amp 2', . . . 'Amp n') including a voltage amplifier (21), feedback capacitor (22) and reset switch (25B), analyser/control units (29, 34), and associated DAC/ADC units (40, 41). The main amplifier parts are shown simply as boxes in FIG. 10, for simplicity. Each amplifier also includes a respective Faraday cup (24), a calibration switch (32) and associated calibration LED (33) controlled by a calibration control signal ('CAL1', 'CAL2', . . . 'CALn') provided by the control unit (34) of the respective main amplifier ('Amp'). These calibration components are shown explicitly for clarity, as will become apparent in the following description of FIG. 10.

The calibration circuit of FIG. 10 includes a collective feedback calibration capability is provided. This calibration circuit is shown as a part of a mass spectrometer, comprising several Faraday cups, each with their own capacitive trans-impedance amplifier (Amp). Of course, the circuit is applicable to other applications than mass spectrometers, in which case the Faraday cups would be replaced by another current source, such as a photo-detector in photometry/imaging applications.

Each capacitive trans-impedance amplifier uses the same, common single calibration capacitor, $C_{cal}$ (31). The common calibration capacitor is electrically connected to the array of capacitive trans-impedance amplifiers ('Amp 1' to 'Amp n'). The single/common capacitor stores a quantity of charge to be distributed across the feed-back capacitors (22) of the array of capacitive trans-impedance amplifiers.

Operation of the respective calibration switches (photodiode (33), when illuminated) permits a transfer of charge from the calibration capacitor ($C_{cal}$) to the respective other feed-back capacitors (22). Each of the other calibration switches may comprise a respective, separate light source (e.g. LED) which is independently controllable to illuminate the calibration switch to render it conductive. Operation of the calibration circuit comprises the following steps:

(1) Charge the calibration capacitor (31), and discharge all of the feed-back capacitors (22) of the capacitive trans-impedance amplifiers to near 0V (zero) or any other desired voltage level (NB in an alternative embodiment, for ratiometric measurements, this step would be applied to a pair of feedback capacitors alone, as discussed above);

(2) Measure the voltages on the outputs of the calibration amplifier and the other capacitive trans-impedance amplifiers (i.e. 'Amp 1' to 'Amp n')). The analyser unit (29) is arranged to implement this operation;

(3) Render conductive the respective calibration switches (32) corresponding to each of the capacitive trans-impedance amplifiers being calibrated (e.g. Illuminate photodiodes of the switches, as appropriate). The control unit (27 or 34) is arranged to implement this operation;

(4) Wait until the voltage on the output of the calibration amplifier reaches a settled level within the operation range of the amplifier. The analyser unit (29) is arranged to implement this operation;

(5) Render the calibration switches (32) non-conductive (e.g. switch off the illumination of the photodiodes of the switches, as appropriate). The control unit (27 or 34) is arranged to implement this operation;

(6) Measure the final voltages on the outputs of the calibration amplifier and each of the capacitive trans-impedance amplifiers being calibrated. The analyser unit (29) is arranged to implement this operation;

(7) Calibrate the capacitive trans-impedance amplifiers feedback capacitor against the calibration capacitor using the following formula:

$$C_n = C_{calibration} \frac{\Delta V_{calibration}}{-\Delta V_n}$$

In this equation: $C_n$ is the capacitance of the calibrated capacitor; $C_{calibration}$ is the capacitance of the calibration capacitor; $\Delta_{calibration}$ is the measured voltage difference between final and initial voltages on the output of the calibration amplifier; $\Delta V_n$ is the measured voltage difference between final and initial voltages on the output of the calibrated amplifier. Note that $\Delta V_{calibration}$ and $\Delta V_n$ will have opposite polarity.

Cooling of an/each amplifier may be implemented, in any embodiment described herein. The invention may include a cooler apparatus/unit (not shown) arranged to cool an/each amplifier to a temperature of around −30 degrees Celsius. In this case the cooling is to reduce the noise_contribution of the amplifier. Amplifier noise translates to an equivalent noise value one expects from the 'resistor equivalent' of the trans-capacitive impedance amplifier of the invention, making the remarkably high resistor equivalents possible. The following approximate relationship has been found for a nominal 10 second integration time using the amplifier of this invention:

| Amplifier Temperature (° C.) | Resistor Equivalent | |
|---|---|---|
| +20 | $10^{12}$ | tested |
| 0 | $10^{13}$ | tested |
| −20 | $10^{14}$ | tested |
| −30 | $10^{14.5}$ | tested |
| −50 | $10^{15}$ | (expected) |

Operational amplifiers employed in this example, are specified to operate at temperatures down to −40 degrees Celsius, however the trend followed down to −30 degrees Celsius can be expected to persist at lower temperatures. This is an enabling feature of the present invention.

It will be appreciated that the embodiments of the invention described above are illustrative examples of implementations of the invention, and are not intended to limit the scope of the invention, such as is defined by the claims. Modifications, variations and equivalent structures/methods for embodiments described above, such as would be readily apparent to the skilled person, are encompassed within the scope of the invention.

The invention claimed is:

1. A capacitive trans-impedance amplifier comprising:
a voltage amplifier having an inverting input terminal for connection to an input current source, and a non-inverting input terminal, the voltage amplifier being arranged to provide at an output terminal thereof an output voltage signal;
a feed-back capacitor coupled between the inverting input terminal and the output terminal to accumulate charges received from the input current source and to generate a feed-back voltage accordingly wherein the capacitor defines a negative feed-back loop of the voltage amplifier such that the output voltage is proportional to said accumulation of said charges;
a calibration unit including a calibration capacitor electrically coupled, via a calibration switch, to said inverting input terminal of said voltage amplifier and thereby electrically coupled to said feed-back capacitor, wherein the calibration unit is operable to switch the calibration switch to a calibration state permitting a discharge of a quantity of charge from the calibration capacitor to the feed-back capacitor;
wherein the capacitive trans-impedance amplifier is arranged to determine a voltage generated across said feed-back capacitor while said calibration switch is in said calibration state and to determine a capacitance value (C=Q/V) for the feed-back capacitor according to the value of the generated voltage (V) and the quantity of charge (Q); and
in which said calibration switch comprises a photodiode operable to attain said calibration state in responsive to receipt of optical radiation sufficient to render the photodiode conductive.

2. The capacitive trans-impedance amplifier according to claim 1 including a reset switch electrically coupled to the inverting input terminal of the voltage amplifier and electrically isolated from the output terminal of the voltage amplifier, wherein the switch is switchable to a state permitting a transfer of charge from the feed-back capacitor or to the feed-back capacitor.

3. The capacitive trans-impedance amplifier according to claim 2 in which the reset switch is switchable to a state permitting a discharge of at least some of said accumulated charge from said feed-back capacitor.

4. The capacitive trans-impedance amplifier according claim 2 in which the reset switch comprises a semiconductor device switchable to generate at a terminal thereof, which is electrically coupled to said inverting input, an electrical charge having a polarity opposite to that of said accumulated charge, thereby permitting said discharge of accumulated charge to neutralise said electrical charge generated by the reset switch.

5. The capacitive trans-impedance amplifier according to claim 3, including a controller unit arranged to monitor a voltage across said feed-back capacitor acquired from said accumulated charge, and to control said reset switch to permit said discharge of accumulated charge when the acquired voltage rises above a first threshold voltage value which lies within the dynamic range of the voltage amplifier.

6. The capacitive trans-impedance amplifier according to claim 5 in which the reset switch is switchable between a first state permitting said discharge of accumulated charge and a second state which does not permit said discharge of accumulated charge, wherein the controller unit is arranged to monitor a voltage across said feed-back capacitor while said switch is in said first state, and to control said reset switch to achieve said second state when the monitored voltage falls below a second threshold voltage value which lies within the dynamic range of the voltage amplifier.

7. The capacitive trans-impedance amplifier according to claim 1 including an analyser unit arranged to determine a rate of change of voltage across the feed-back capacitor resulting from said accumulation of charge, and to generate a current value representing a current received by the capacitive trans-impedance amplifier from said input current source.

8. The capacitive trans-impedance amplifier according to claim 1 in which the voltage amplifier comprises an operational amplifier.

9. The capacitive trans-impedance amplifier according to claim 2 in which said reset switch comprises a diode.

10. The capacitive trans-impedance amplifier according to claim 1 in which said calibration switch comprises a diode.

11. The capacitive trans-impedance amplifier according to claim 1 comprising a cooler apparatus/unit arranged to cool the voltage amplifier to a temperature falling between 0 (zero) degrees Celsius and −50 degrees Celsius to reduce thermal noise in the voltage amplifier.

12. A mass spectrometer comprising an ion beam current measurement device comprising the capacitive trans-impedance amplifier according to claim 1.

13. A method of capacitive trans-impedance amplification comprising:
providing a voltage amplifier having an inverting input terminal electrically coupled to an input current source, and a non-inverting input terminal, the voltage amplifier being arranged to provide an output voltage signal at an output terminal thereof;
providing a feed-back capacitor coupled between the inverting input terminal and the output terminal to accumulate charges received from the input current source and to generate a feed-back voltage accordingly wherein the capacitor defines a negative feed-back loop of the voltage amplifier such that the output voltage is proportional to said accumulation of said charges;
providing a calibration unit including a calibration capacitor electrically coupled, via a calibration switch comprising a photodiode, to said inverting input terminal of said voltage amplifier and thereby electrically coupled to said feed-back capacitor,
switching, by the calibration unit, the calibration switch to a calibration state permitting a discharge of a predetermined charge from the calibration capacitor to the feed-back capacitor,
determining a voltage generated across said feed-back capacitor while said calibration switch is in said calibration state;
determining a capacitance value (C=Q/V) for the feed-back capacitor according to the value of the generated voltage (V) and the predetermined charge (Q); and
attaining said calibration state in response to receipt of optical radiation sufficient to render the photodiode conductive.

14. The method according to claim 13 including;
providing a reset switch electrically coupled to the inverting input terminal of the voltage amplifier and electrically isolated from the output terminal of the voltage amplifier;
using the feed-back capacitor to accumulate charges received from the input current source and generating said output voltage accordingly such that the output voltage is proportional to said accumulation of said charges; and,
switching the reset switch to a state permitting a transfer of charge from the feed-back capacitor or to the feed-back capacitor.

15. The method according to claim 14 including switching the reset switch to a state permitting a discharge of at least some of said accumulated charge from said feed-back capacitor.

16. The method according to claim 14 in which the reset switch comprises a semiconductor device and the method includes switching the reset switch to generate at a terminal thereof, which is electrically coupled to said inverting input, an electrical charge having a polarity opposite to that of said accumulated charge, thereby permitting said discharge of accumulated charge to neutralise said electrical charge generated by the reset switch.

17. The method according to claim 14, including monitoring a voltage across said feed-back capacitor acquired from said accumulated charge, and controlling said reset switch to permit said discharge of accumulated charge when the acquired voltage rises above a first threshold voltage value which lies within the dynamic range of the voltage amplifier.

18. The method according to claim 17 including switching the reset switch between a first state permitting said discharge of accumulated charge and a second state which does not permit said discharge of accumulated charge, wherein the method includes monitoring a voltage across said feed-back capacitor while said reset switch is in said first state, and to controlling said reset switch to achieve said second state when the monitored voltage falls below a second threshold voltage value which lies within the dynamic range of the voltage amplifier.

19. The method according to claim 13 including determining a rate of change of voltage across the feed-back capacitor resulting from said accumulation of charge, and generating a current value representing a current received by the feed-back capacitor from said input current source.

* * * * *